(12) United States Patent
Takano et al.

(10) Patent No.: US 7,384,662 B2
(45) Date of Patent: Jun. 10, 2008

(54) THROUGH STRUCTURE OF CONNECTING LINE AT GASTIGHT CHAMBER, AND EJECTION SYSTEM INCORPORATING SAME; METHOD OF MANUFACTURING LCD DEVICE, ORGANIC EL DEVICE, ELECTRON EMITTING DEVICE, PDP DEVICE, ELECTROPHORESIS DISPLAY DEVICE, COLOR FILTER, AND ORGANIC EL; AND METHOD OF FORMING SPACER, METAL WIRING, LENS, RESIST, AND LIGHT DIFFUSER

(75) Inventors: Yutaka Takano, Asahi-mura (JP); Shinichi Nakamura, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 477 days.

(21) Appl. No.: 10/367,719

(22) Filed: Feb. 19, 2003

(65) Prior Publication Data

US 2003/0176005 A1    Sep. 18, 2003

(30) Foreign Application Priority Data

Mar. 15, 2002    (JP) .............................. 2002-072676

(51) Int. Cl.
*B05D 5/06*     (2006.01)
*B05D 5/12*     (2006.01)
*C23C 14/00*    (2006.01)
*B05B 3/00*     (2006.01)
*B05C 13/02*    (2006.01)
*F16L 5/02*     (2006.01)

(52) U.S. Cl. .................... 427/64; 427/164; 427/123; 118/50; 118/323; 118/305; 174/52.3; 277/606; 277/607; 277/627

(58) Field of Classification Search ................ 118/50, 118/52, 612, 305, 323, 300, 313, 46; 438/48; 277/606, 607, 609, 616, 627, 316; 174/35 GC, 174/48, 50, 52.3, 93, 65 SS, 65 G; 427/58, 427/64, 66, 68, 164, 123, 162, 163.1, 256, 427/200; 347/20, 37
See application file for complete search history.

(56) References Cited

U.S. PATENT DOCUMENTS 3,916,088 A * 10/1975 Keller ..................... 174/152 R
4,361,716 A * 11/1982 Keller ........................ 373/147

(Continued)

FOREIGN PATENT DOCUMENTS

JP    U-57-063424    4/1982

(Continued)

*Primary Examiner*—Yewebdar T Tadesse
(74) *Attorney, Agent, or Firm*—Oliff & Berridge, PLC

(57) ABSTRACT

There is provided a through structure of connecting lines extending through a wall of a gastight chamber. The through structure of the connecting lines is capable of positively sealing between the wall and the connecting lines extending therethrough. The through structure enables the connecting lines to extend through the wall of the gastight chamber for connecting a work processing apparatus contained in the gastight chamber and accessories for the work processing apparatus. The through structure comprises a through sleeve extending through the wall, with the connecting lines extending therethrough, a first seal member filled in the through sleeve for sealing between the through sleeve and the connecting lines, and a second seal member for sealing between the through sleeve and the wall.

19 Claims, 23 Drawing Sheets

U.S. PATENT DOCUMENTS

| | | | |
|---|---|---|---|
| 4,519,014 A * | 5/1985 | Skovran et al. | 361/748 |
| 5,921,791 A * | 7/1999 | Ono et al. | 439/157 |
| 6,066,357 A * | 5/2000 | Tang et al. | 427/66 |
| 6,420,834 B2 * | 7/2002 | Yamazaki et al. | 315/169.3 |
| 2001/0006042 A1 * | 7/2001 | Iijima et al. | 118/718 |

FOREIGN PATENT DOCUMENTS

| | | |
|---|---|---|
| JP | U-04-080989 | 7/1992 |
| JP | A-06-090867 | 4/1994 |
| JP | A-11-0248927 | 9/1999 |
| JP | A-2002-048416 | 2/2002 |

* cited by examiner

F I G. 6
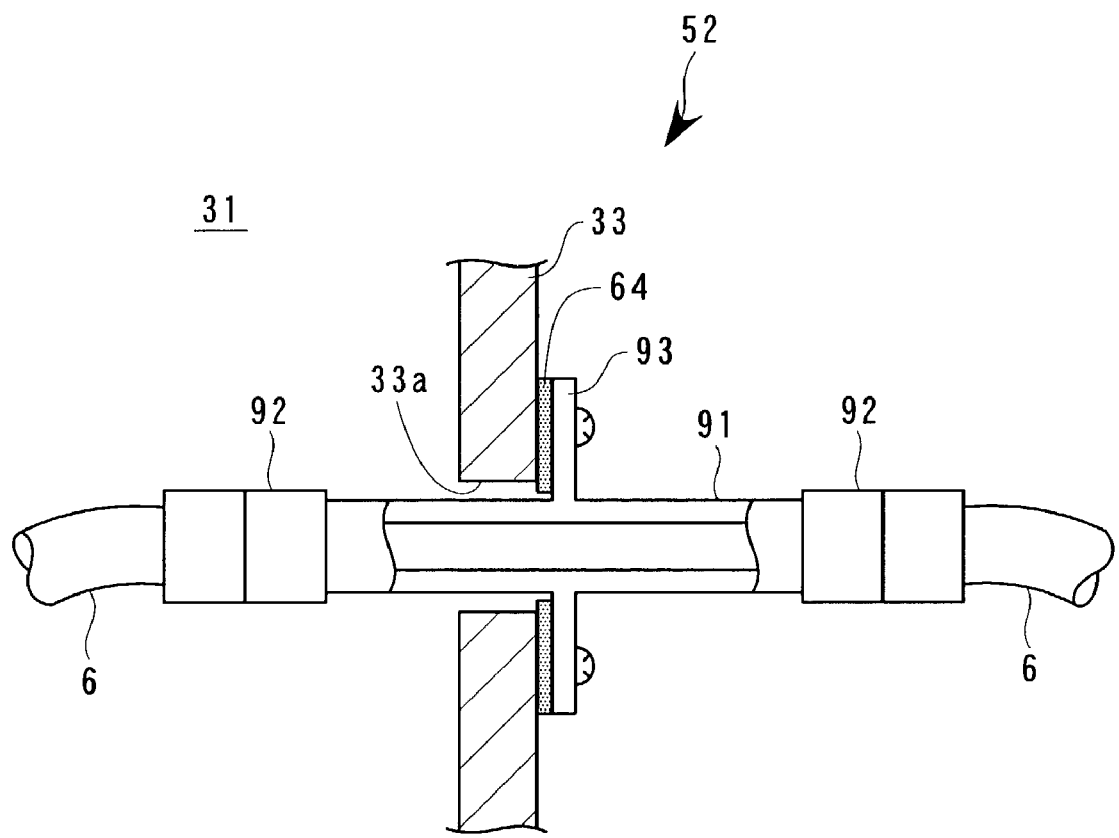

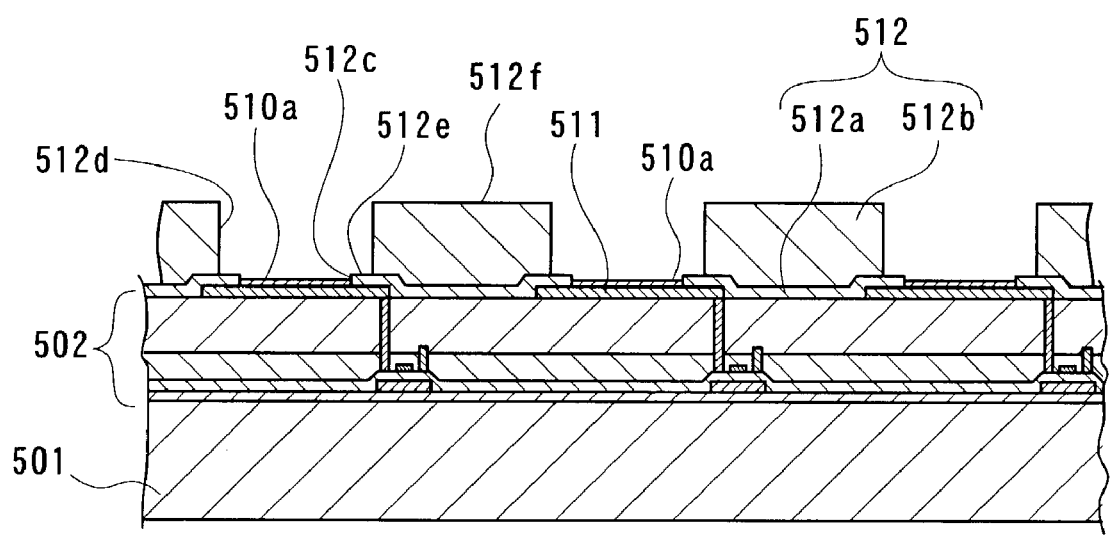
F I G. 1 8

F I G. 2 1
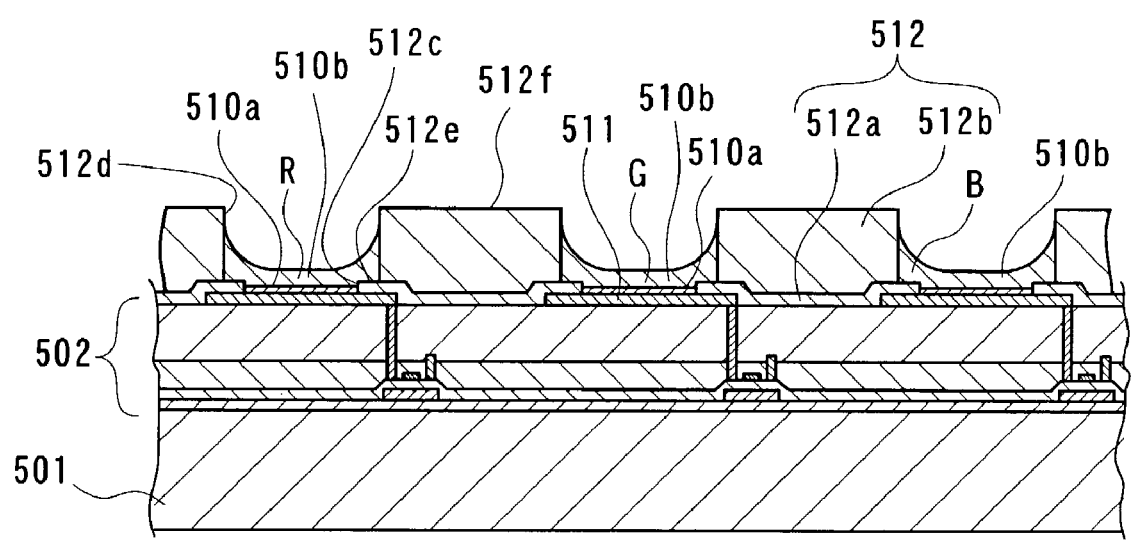

THROUGH STRUCTURE OF CONNECTING LINE AT GASTIGHT CHAMBER, AND EJECTION SYSTEM INCORPORATING SAME; METHOD OF MANUFACTURING LCD DEVICE, ORGANIC EL DEVICE, ELECTRON EMITTING DEVICE, PDP DEVICE, ELECTROPHORESIS DISPLAY DEVICE, COLOR FILTER, AND ORGANIC EL; AND METHOD OF FORMING SPACER, METAL WIRING, LENS, RESIST, AND LIGHT DIFFUSER

BACKGROUND OF THE INVENTION

1. Field of the Invention

This invention relates to: a through structure of a connecting line passing through a wall of an gastight chamber, the connecting line being formed by piping and/or wiring for connecting a work processing apparatus, such as a liquid droplet ejecting apparatus or the like, contained in the gastight chamber and accessories for the work processing apparatus, and an ejection system incorporating the through structure; a method of manufacturing a liquid crystal display (LCD) device, an organic electroluminecence (EL) device, an electron emitting device, a plasma display panel (PDP) device, an electrophoresis display device, and a color filter, an organic EL; as well as a method of forming a spacer, a metal wiring, a lens, a resist, and a light diffuser.

2. Description of Related Art

Conventionally, in a work processing apparatus, such as a color filter manufacturing apparatus, an organic EL device manufacturing apparatus or the like, so as to maintain the quality of products, the manufacturing apparatus itself is contained in a gastight chamber, and manufacturing operations are carried out while controlling temperature, an inert gas atmosphere, etc., as desired.

In the manufacturing apparatuses of this kind, a processing apparatus for actually processing a work, and accessories therefor, such as a controller (personal computer) for delivering control signals and the like to the processing apparatus, an air-feeding device for feeding compressed air to the processing apparatus, are usually arranged independently of each other due to different forms of maintenance required therefor. The processing apparatus and the accessories therefor are connected by various types of piping and wiring.

In the above case, when only the processing apparatus requiring the control of the atmosphere thereof is contained in the gastight chamber in view of a initial cost and a running cost, the piping and wiring connecting between the processing apparatus and the accessories have to be passed through a wall of the gastight chamber, and leakage of the atmosphere from the wall is expected to cause problems in controlling the temperature and the atmosphere.

SUMMARY OF THE INVENTION

This invention provides: a through structure of a connecting line extending into a gastight chamber, which is capable of reliably sealing between a wall of the gastight chamber and the connecting line extending therethrough, and an ejection system incorporating the through structure; and a method of manufacturing a liquid crystal display device, an organic EL device, an electron emitting device, a PDP device, an electrophoresis display device, a color filter, and an organic EL; as well as a method of forming a spacer, a metal wiring, a lens, a resist, and a light diffuser.

According to one aspect of the invention, there is provided a through structure of a connecting line extending through a wall of a gastight chamber, the connecting line being formed by at least one of piping and wiring for connecting a work processing apparatus contained in the gastight chamber and accessories for the work processing apparatus. The through structure comprises: a through sleeve extending through the wall, with the connecting line extending through the through sleeve; a first seal member filled in the through sleeve, for sealing between the through sleeve and the connecting line; and a second seal member for sealing between the through sleeve and the wall.

According to this through structure, the first seal member is filled in the through sleeve, for sealing between the through sleeve and the connecting line, and hence even if the connecting line is made of a flexible material, it can be sealed over a relatively long distance. This contributes to enhancement of the sealing performance of the first seal member. Further, the connecting line can be protected from a through hole formed through the wall by the through sleeve, and held in an immovable state by the first seal member. On the other hand, the second seal member seals between the through sleeve and the wall, so that the sealing is effected by the first and second seal members both of which are fixed members. Therefore, proper sealing can be easily effected, and the sealing performance of the sealing members can be enhanced.

Preferably, the through sleeve includes a hollow cylindrical sleeve body, and a flange portion formed on an outer peripheral surface of the sleeve body, and the second seal member is interposed between the flange portion and the wall.

Preferably, the flange portion is rigidly fixed to an outside surface of the wall, with the second seal member being interposed between the flange portion and the wall.

According to the above arrangement, the second seal member is interposed between the flange portion and the wall, whereby it is possible to seal between the flange portion and the wall by the second seal member formed to have a relatively large area. This makes it possible to further enhance sealing properties imparted to this part. Further, since the flange portion and the second seal member are fixed to the outside surface of the wall, it is easy to carry out operations therefor, and hence workability is improved.

Preferably, the connecting line includes a short line extending through the through sleeve and formed to have a length slightly larger than that of the through sleeve, and a pair of connector members connected to opposite ends of the short line.

According to this arrangement, the short line forming part of the connecting line is incorporated in the through sleeve, whereby it is possible to omit troublesome operations, such as the routing of the connecting line, and thereby improve workability. Further, the pair of connector members connected to the opposite ends of the short line prevent operations for connecting the short line and the respective connecting lines inside and outside of the gastight chamber from becoming troublesome. Incidentally, it is preferable that connectors of a one-touch connection type are used as the pair of connector members. Further, to prevent a connecting error in connecting the connectors, it is preferred that the type of the connecting line is clearly shown by a seal or the like attached to an end portion of each short line or connector.

Preferably, the first seal member is formed of a wet seal material, and the second seal member is formed of a dry seal material.

More preferably, the through sleeve has cap members attached to opposite ends thereof, respectively.

According to these preferred embodiments, the first seal member is formed of a wet seal material, whereby it is possible to reliably seal a connecting line, especially when it is flexible. Further, by injecting the seal member into the through sleeve, the first seal member can be filled in the through sleeve, which contributes to improved workability of the first seal member. Further, the opposite ends of the through sleeve are closed by the cap members, whereby it is possible to compress the first seal member as required for improving its sealing performance as well as to prevent degradation of the first seal member. On the other hand, the second seal member is formed of a dry seal material, which makes it possible to handle the seal member with ease as well as to seal the flange portion and the wall properly, especially when they are formed of hard materials. It should be noted that as the first seal member, a caulking material, such as a silicone sealant or the like is preferably used, and further, a low siloxane-type caulking material is more preferably used. Further, as the second seal member, a so-called packing (gasket) is preferable.

According to another aspect of the invention, there is provided a through structure of a connecting line extending through a wall of a gastight chamber, the connecting line being formed by piping for connecting a work processing apparatus contained in the gastight chamber and accessories for the work processing apparatus. The through structure comprises: a short pipe extending through the wall, with a flow passage formed therethrough; a pair of connectors connected to opposite ends of the short pipe; a flange formed on an outer peripheral surface of the short pipe; and a seal member interposed between the flange and the wall.

According to this through structure, the short pipe forming part of the piping is configured to be used as the above through sleeve, and hence it is possible to simplify the structure of sealing portions (it is only required to provide one sealing portion), thereby making it possible to enhance the sealing performance and mounting workability of the seal member. Further, the pair of connectors connected to the opposite ends of the short pipe make it possible to prevent connecting operations for connecting the short pipe and the piping inside and outside of the gastight chamber from becoming troublesome. Incidentally, it is preferable that connectors of a one-touch connection type are used as the pair of connectors. Further, when it is desired to cause a plurality of piping to collectively extend through the wall, it is preferable to employ a common flange comprised of a plurality of flanges integrally formed with each other, and at the same time the type of piping (or connector) hall preferably be clearly shown by a seal or the like attached thereto.

According to still another aspect of the invention, there is provided an ejection system comprising: a gastight chamber; a work processing apparatus contained in the gastight chamber; accessories for the work processing apparatus; a connecting line formed by at least one of piping and wiring for connecting the work processing apparatus and the accessories; and a through structure of the connecting line extending into a gastight chamber, wherein the work processing apparatus is a liquid droplet ejecting apparatus that has a functional liquid droplet ejecting head into which functional liquid are introduced, and selectively ejects functional liquid droplets onto a substrate as a work, while causing the functional liquid droplet ejecting head to scan relative to the substrate.

According to still another aspect of the invention, there is provided an ejection system comprising: a gastight chamber; a work processing apparatus contained in the gastight chamber; accessories for the work processing apparatus; a connecting line formed by piping for connecting the work processing apparatus and the accessories; and a through structure of the connecting line extending into the gastight chamber, wherein the work processing apparatus is a liquid droplet ejecting apparatus that has a functional liquid droplet ejecting head into which a functional liquid is introduced, and selectively ejects functional liquid droplets onto a substrate as a work, while causing the functional liquid droplet ejecting head to scan relative to the substrate.

According to these ejection systems, it is possible to positively prevent leakage of the inner atmosphere of the gastight chamber from a wall portion through which the short pipe extends into the chamber. Therefore, it is possible to carry out appropriate work processing and prevent environmental pollution etc. caused by the leakage of the inner atmosphere.

According to still another aspect of the invention, there is provided a method of manufacturing a liquid crystal display device, by using the above-described ejection system, the liquid crystal display device having filter elements formed on a substrate of a color filter thereof. The method comprises the steps of: introducing a filter material into the functional liquid droplet ejecting head; and forming the filter elements by causing the functional liquid droplet ejecting head to scan relative to the substrate and selectively eject the filter material.

According to another aspect of the invention, there is provided a method of manufacturing an organic EL device, by using the above-described ejection system, the organic EL device having EL light emitting layers (or light-emitting layers) formed on pixels on a substrate thereof. The method comprises the steps of: introducing light emitting materials of colors into the functional liquid droplet ejecting head; and forming the EL light emitting layers by causing the functional liquid droplet ejecting head to scan relative to the substrate and selectively eject the light emitting materials.

According to still another aspect of the invention, there is provided a method of manufacturing an electron emitting device, by using the above-described ejection system, the electron emitting device having phosphors formed on electrodes thereof. The method comprises the steps of: introducing fluorescent materials into the functional liquid droplet ejecting head; and forming the phosphors by causing the functional liquid droplet ejecting head to scan relative to the electrodes and selectively eject the fluorescent materials.

According to another aspect of the invention, there is provided a method of manufacturing a PDP device, by using the above-described ejection system, the PDP device having phosphors formed in concave portions of a back substrate thereof. The method comprises the steps of: introducing fluorescent materials into the functional liquid droplet ejecting head; and forming the phosphors by causing the functional liquid droplet ejecting head to scan relative to the back substrate and selectively eject the fluorescent materials.

According to still another aspect of the invention, there is provided a method of manufacturing an electrophoresis display device, by using the above-described ejection system, the electrophoresis display device having migration elements formed in concave portions of electrodes thereof. The method comprises the steps of: introducing migration element materials into the functional liquid droplet ejecting head; and forming the migration elements by causing the functional liquid droplet ejecting head to scan relative to the electrodes and selectively eject the migration element materials.

As described above, the above-described ejection system is applied to the liquid crystal display device manufacturing method, the organic EL (Electro-Luminescence) device manufacturing method, the electron emitting device manufacturing method, the PDP (Plasma Display Panel) device manufacturing method, and the electrophoresis display device manufacturing method, whereby it is possible to enhance the qualities of the light emitting layers, phosphors, and so forth, demanded of the devices. Further, in general, the functional liquid droplet ejecting heads are moved for main scanning and sub scanning. However, when so-called "one line" is formed by a single liquid droplet ejecting head, the head is moved only for sub scanning. Further, the electron emitting device is a concept including a Field Emission Display (FED) device.

According to still another aspect of the invention, there is provided a method of manufacturing a color filter by using the above-described ejection system, the color filter having filter elements arranged on a substrate thereof. The method comprises the steps of: introducing filter materials into the functional liquid droplet ejecting head; and forming the filter elements by causing the functional liquid droplet ejecting head to scan relative to the substrate and selectively eject the filter materials.

Preferably, the color filter includes an overcoating layer covering the filter elements, and the method further includes, subsequent to the step of forming the filter elements, the steps of introducing a transparent coating material into the functional liquid droplet ejecting head, and forming the overcoating layer by causing the functional liquid droplet ejecting head to scan relative to the substrate and selectively eject the coating material.

According to another aspect of the invention, there is provided a method of manufacturing an organic EL, by using the above-described ejection system, the organic EL having pixels, including EL light emitting layers, arranged on a substrate thereof. The method comprises the steps of: introducing light emitting materials into the functional liquid droplet ejecting head; and forming the EL light emitting layers by causing the functional liquid droplet ejecting head to scan relative to the substrate and selectively eject the light emitting materials.

Preferably, the organic EL includes pixel electrodes formed between the EL light emitting layers and the substrate in a manner associated with the EL light emitting layers, respectively, and the method further includes the steps of introducing an electrode material in a liquid form into the functional liquid droplet ejecting head, and forming the pixel electrodes, by causing the functional liquid droplet ejecting head to scan relative to the substrate and selectively eject the electrode material.

More preferably, the organic EL has opposed electrodes formed in a manner covering the EL light emitting layers, and the method further includes, subsequent to the step of forming the EL light emitting layers, the steps of introducing an electrode material in a liquid form into the functional liquid droplet ejecting, and forming the opposed electrodes, by causing the functional liquid droplet ejecting head to scan relative to the substrate and selectively eject the electrode material in the liquid form.

According to another aspect of the invention, there is provided a method of forming particulate spacers, by using the above-described ejection system, the spacers creating very small cell gaps between two substrates. The method comprises the steps of: introducing a particle material for forming the spacers into the functional liquid droplet ejecting heads; and causing the functional liquid droplet ejecting head to scan relative to at least one of the two substrates and selectively eject the particle material, thereby forming the spacers on the substrate.

According to still another aspect of the invention, there is provided a method of forming metal wiring on a substrate, by using the above-described ejection system. The method comprises the steps of: introducing a metal material in a liquid form into the functional liquid droplet ejecting head; and forming the metal wiring by causing the functional liquid droplet ejecting head to scan relative to the substrate and selectively eject the metal material.

According to another aspect of the invention, there is provided a method of forming microlenses on a substrate, by using the above-described ejection system. The method comprises the steps of: introducing a lens material into the functional liquid droplet ejecting head; and forming the microlenses by causing the functional liquid droplet ejecting head to scan relative to the substrate and selectively eject the lens material.

According to still another aspect of the invention, there is provided a method of forming a resist having a desired shape on a substrate, by using the above-described ejection system. The method comprises the steps of: introducing a resist material into the functional liquid droplet ejecting head; and forming the resist by causing the functional liquid droplet ejecting head to scan relative to the substrate and selectively eject the resist material.

According to still another aspect of the invention, there is provided a method of forming light diffusers on a substrate, by using the above-described ejection system. The method comprises the steps of: introducing a light diffusing material into the functional liquid droplet ejecting head; and forming the light diffusers by causing the functional liquid droplet ejecting head to scan relative to the substrate and selectively eject the light diffusing material.

As described above, the above-described ejection system is applied to the color filter manufacturing method, the organic EL manufacturing method, the spacer forming method, the metal wiring forming method, the lens forming method, the resist forming method, and the light diffuser forming method, whereby it is possible to enhance the qualities of the light emitting layers and so forth demanded of the electronic devices and the optical devices.

BRIEF DESCRIPTION OF THE DRAWINGS

FIG. 6 is an enlarged cross-sectional view showing a portion of a gastight chamber according to a second embodiment through which piping extends into the gastight chamber, and component parts associated therewith;

FIGS. 8A and 8B are enlarged partial views of a color filter manufactured by a color filter manufacturing method according to an embodiment of the invention, in which:

FIG. 8A is a schematic fragmentary plan view of the color filter; and

FIG. 8B is a cross-sectional view of the color filter taken on line B-B of FIG. 8A;

FIG. 18 is a cross-sectional view useful in explaining the surface modification process (drying treatment) in the organic EL device manufacturing method according to the embodiment;

FIG. 21 is a cross-sectional view useful in explaining a process for forming R light, G light-, B light emitting layers in the organic EL device manufacturing method according to the embodiment;

DESCRIPTION OF THE PREFERRED EMBODIMENTS

The invention will now be described in detail with reference to the drawings showing preferred embodiments thereof. Ink jet heads (functional liquid droplet ejecting heads) of an ink jet printer are capable of accurately ejecting very small ink droplets (liquid droplets) for forming the same into dots, and hence it is expected that they can be applied to various fields of component-manufacturing by using special inks, light emitting or photosensitive resins, etc. as functional liquid droplets (to-be-ejected liquids).

An ejection system according to the present embodiment is applied to a manufacturing apparatus for manufacturing so-called flat displays, such as an organic EL device, and a color filter. The ejection system ejects functional liquid droplets e.g. of a light emitting material from a plurality of functional liquid droplet ejecting heads thereof in the atmosphere of an inert gas, thereby forming an EL light emitting layer and a positive hole-injecting layer of pixels, which implement the light emitting function of the organic EL device.

In the following, the description will be given of an ejection system which is applied, according to the present embodiment, to a manufacturing apparatus for manufacturing an organic EL device, and of the construction of the organic EL device manufactured by the manufacturing apparatus, and a manufacturing method (manufacturing process) for manufacturing the organic EL device, as well as of the construction of a color filter and a manufacturing method (manufacturing process) for manufacturing the color filter, as applications of the construction and the method related to the organic EL device.

Figure 1:
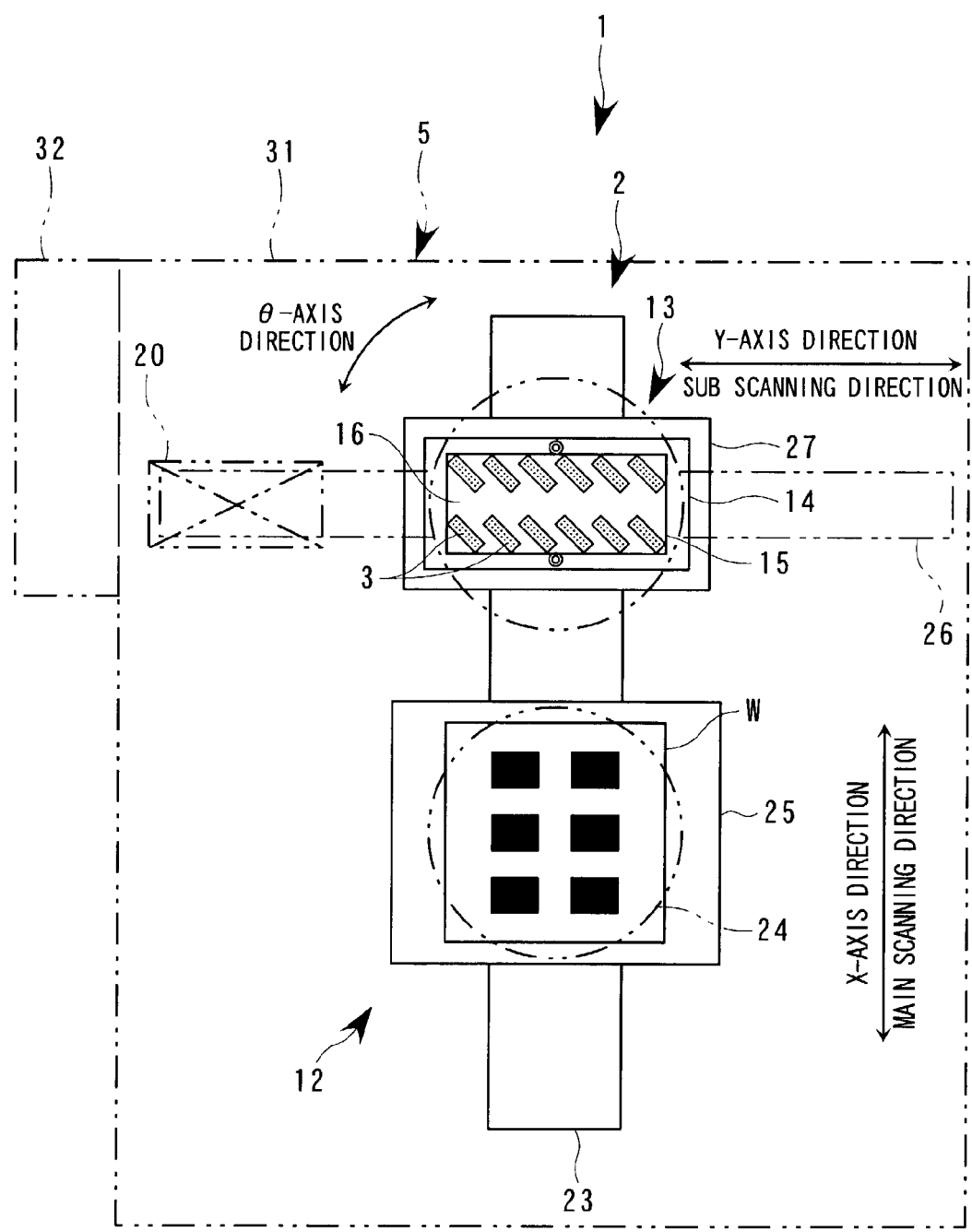
FIG. 1 is a plan view schematically showing a liquid droplet ejecting apparatus for an ejection system according to an embodiment of the invention.
Figure 2:
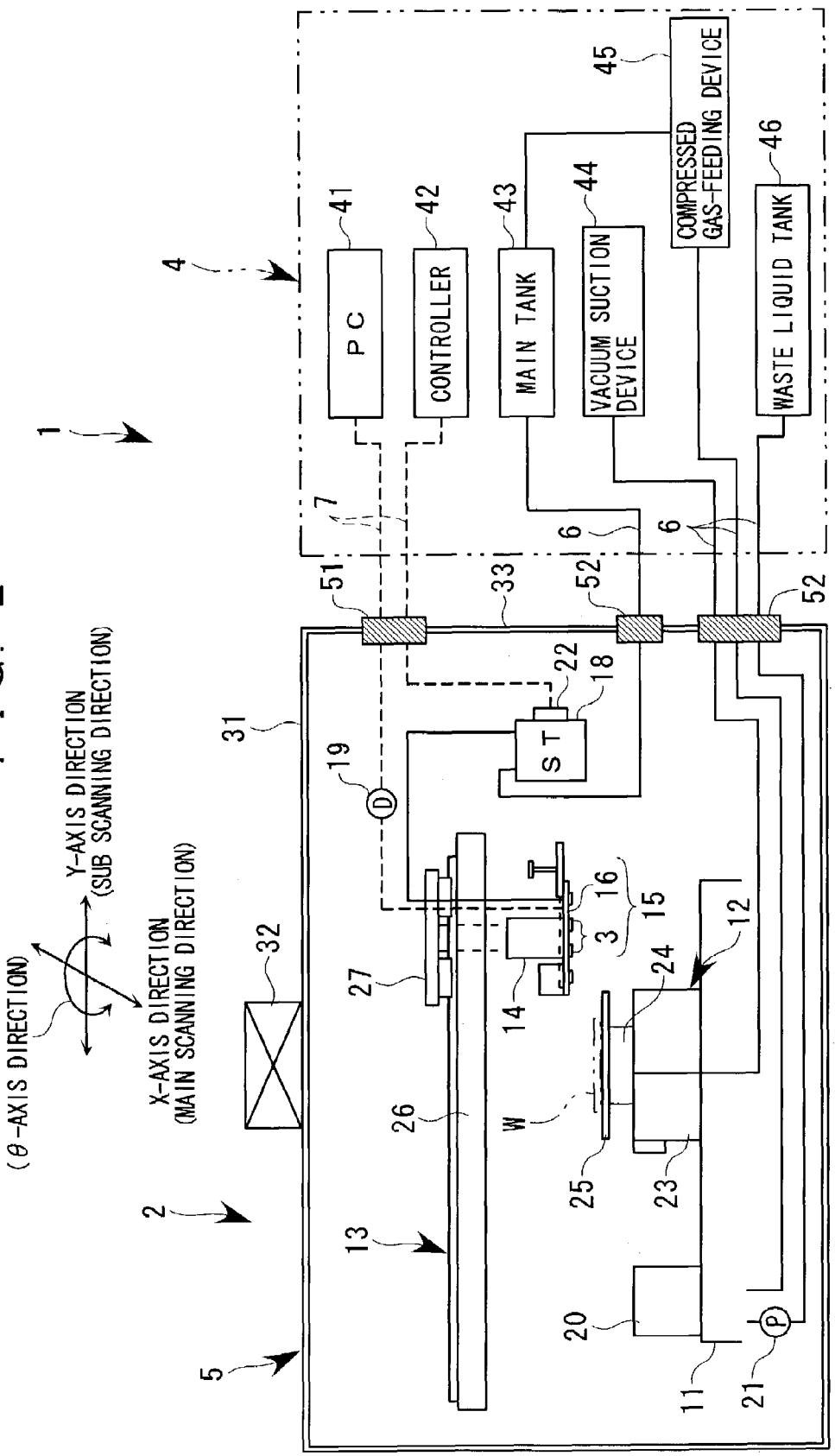
FIG. 2 is a side view schematically showing the ejection system (liquid droplet ejecting apparatus and accessories therefor) according to the embodiment.

Referring to FIGS. 1 and 2, the ejection system 1 according to the present embodiment includes a liquid droplet ejecting apparatus (work processing apparatus) 2 having the functional liquid droplet ejecting heads 3 mounted thereon, and accessories 4 (see FIG. 2) for supplying functional liquid droplets etc. to the liquid droplet ejecting apparatus 2. The liquid droplet ejecting apparatus 2 is contained in a chamber unit 5. The chamber unit 5 and the accessories 4 arranged outside the chamber unit 5 are connected to each other by connecting tubes (piping) 6 and connecting cables (wiring) 7. More specifically, the liquid droplet ejecting apparatus 2 ejects a light emitting material (functional liquid) onto a substrate W, which is a work, through the functional liquid droplet ejecting heads 3 carried thereon, thereby forming the light emitting layer and the like of the organic EL device. A sequence of the manufacturing operations by the liquid droplet ejecting apparatus 2, including an ejection operation by the functional liquid droplet ejecting heads 3, are carried out in the atmosphere of inert gas (nitrogen gas) formed within the chamber unit 5.

The liquid droplet ejecting apparatus 2 is comprised of a base 11 formed by a stone surface plate and the like, an X-axis table 12 arranged on the base 11, a Y-axis table 13 orthogonal to the X-axis table 12, a main carriage 14 arranged under the Y-axis table 13 in a manner suspended therefrom, and a head unit 15 mounted on the main carriage 14. The head unit 15 has the plurality of functional liquid droplet ejecting heads 3 mounted thereon via a sub-carriage 16, as described in detail hereinafter.

Further, the liquid droplet ejecting apparatus 2 incorporates a sub-tank 18 for supplying functional liquid (light emitting material) to the functional liquid droplet ejecting heads 3 as well as a head driver 19 for driving the functional liquid droplet ejecting heads 3 to cause the same to eject the functional liquid. Further, the liquid droplet ejecting apparatus 2 incorporates a flushing unit, not shown, for receiving regular flushing (non-printing ejection of functional liquid from all the nozzles) of the functional liquid droplet ejecting heads 3, a wiping unit, not shown, for wiping the surfaces of the nozzles of the functional liquid droplet ejecting heads 3, and a cleaning unit 20 for sucking functional liquid from the functional liquid droplet ejecting heads 3 for storage.

The X-axis table 12 includes a linear motor-driven X-axis slider 23 forming a driving system operating in an X-axis direction, and a θ table 24 and a suction table 25 for attracting the substrate W by suction of air, both mounted on the X-axis slider 23. Further, the Y-axis table 13 includes a ball screw and a servomotor-driven Y-axis slider 26 forming a driving system operating in a Y-axis direction, and a bridge plate 27 mounted on the Y-axis slider 26, for suspending the main carriage 14.

The head unit 15 carried by the main carriage 14 has the plurality of functional liquid droplet ejecting heads 3 mounted thereon via the sub-carriage 16. On the sub-carriage 16 are mounted twelve functional liquid droplet ejecting heads 3, not shown in a specifically detailed manner, such that the twelve ejecting heads 3 are divided into two groups each comprised of six heads each of which is arranged in a manner inclined at a predetermined angle relative to a main scanning direction (see FIG. 1).

The liquid droplet ejecting apparatus 2 according to the present embodiment is configured such that the substrate W is moved in synchronism with the driving of the functional liquid droplet ejecting heads 3 (for selective ejection of functional liquid droplets). A so-called main scanning of the functional liquid droplet ejecting heads 3 is performed in accordance with reciprocating motion of the X-axis table 12 in the X-axis direction. Further, in a manner corresponding to the main scanning, a so-called sub scanning is carried out by the Y-axis table 13 in accordance with reciprocating motion of the functional liquid droplet ejecting heads 3 in the Y-axis direction.

The chamber unit 5 includes a chamber room (gastight chamber) 31, and a gas-feeding device 32 for feeding inert gas whose temperature and water are controlled, to the chamber room 31, and is in the form of a so-called clean room. Nitrogen gas as the inert gas is introduced into the chamber room 31. The liquid droplet ejecting apparatus 2 contained in the chamber room 31 is exposed to the atmosphere of nitrogen gas and operated in the atmosphere of nitrogen gas.

The accessories 4 include a personal computer (PC) 41, a controller 42 for performing integrated control of the liquid droplet ejecting apparatus 2, and a main tank 43 for feeding functional liquid to the above sub-tank 18, all of which are mounted on a common base of a cabinet type, not shown, as well as a vacuum suction device 44 connected to the suction table 25 and other related components, a compressed gas-feeding device 45 connected to a gas cylinder of the cleaning unit 20, and the main tank 43, and a waste ink tank 46 connected to the cleaning unit etc., via a suction pump 21. It should be noted that in the present embodiment, inert gas whose temperature and water are controlled is used as the gas fed from the compressed gas-feeding device 45.

For instance, the personal computer 41 produces and sends out ejection pattern data of functional liquid to be ejected from the functional liquid droplet ejecting heads 3, to the head driver 19 of the liquid droplet ejecting apparatus 2, while the controller 42 controls the feeding of functional liquid from the main tank 43, via the compressed gas-feeding device 45, based on a result of detection by a level sensor 22 arranged in the sub-tank 18. The connection between the personal computer 41 and the head driver 19, and that between the level sensor 22 and the controller 42 are effected by the connecting cables 7 passed through a wiring-through unit 51 extending through a wall (mainly, an upper portion of a side wall) 33 of the chamber room 31.

Further, the connection between the sub-tank 18 and the main tank 43 is effected by the connecting tubes 6 via a piping-through unit 52 extending through the wall (mainly, a lower portion of the side wall) 33 of the chamber room 31. Similarly, the connection between the suction table 25 and the vacuum suction device 44, that between the gas cylinder of the cleaning unit 20 and the compressed gas-feeding device 45, and that between the suction pump 21 of the cleaning unit 20 and the waste ink tank 46 are effected by the connecting tubes 6 via a piping-through unit 52 extending through the wall (mainly, the lower portion of the side wall) 33 of the chamber room 31.

Figure 3A:
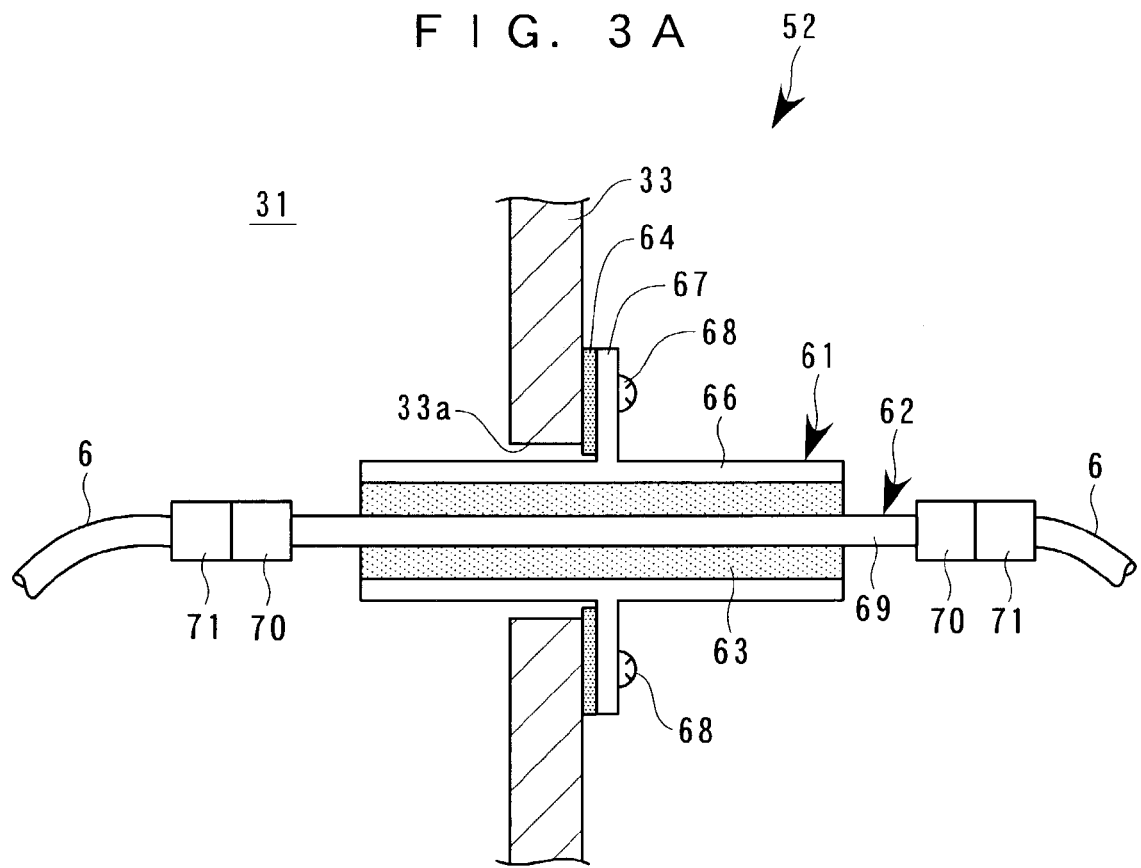
FIGS. 3A and 3B are enlarged cross-sectional views each showing a portion of an gastight chamber through which piping extends into the chamber, and component parts associated therewith.

Now, the wiring-through unit 51 and the piping-through units 52 forming essential parts of the present invention will be described in detail with reference to FIGS. 3A to 7. FIG. 3A illustrates the simplest form of construction of the piping-through unit 52 by way of example of a basic through structure of the connecting tube 6 and the connecting cable 7 (connecting lines) extending through the wall of the chamber room 31. Although in the present embodiment, description is given by taking a flat flexible cable (FFC) as an example of the connecting cable 7, it goes without saying that various types of cables are employed depending on the use of the connecting cable. Similarly, although description is given by taking a silicone tube as an example of the connecting tube 6, it goes without saying that various types of tubes (or resin pipes) are employed depending on the use of the connecting tube.

As shown in the figure, the piping-through unit 52 is comprised of a through sleeve 61 extending through a through hole 33a formed through the wall 33 of the camber room 31, a short tube 62 extending through the through sleeve 61 to form part of the connecting tube 6, a first seal member 63 filled in the through sleeve 61 for sealing between an inner peripheral surface of the through sleeve 61 and the short tube 62, and a second seal member 64 for sealing between an outer peripheral surface of the through sleeve 61 and the wall 33. More specifically, the through hole 33a of the wall 33 and the connecting tube 6 (short tube 62 thereof) are sealed by the first seal member 63 inside the through sleeve 61, and the second seal member 64 outside the through sleeve 61, via the through sleeve 61.

The through sleeve 61 is formed of a pipe material excellent in corrosion resistance, such as stainless steel, aluminum, resin, or the like and is comprised of a hollow cylindrical sleeve body 66, and a flange portion 67 integrally formed with a longitudinally intermediate portion of an outer peripheral surface of the sleeve body 66. The flange portion 67 is formed with a plurality of circular holes, not shown, along a periphery thereof such that the through sleeve 61 is rigidly fixed to the wall 33 by screwing fixing screws 68 through the circular holes in a state where the flange portion 67 is held against the outside of the wall 33. It should be noted that the through sleeve 61 is configured to have a sufficiently larger diameter than that of the connecting tube 6, and the length thereof is determined by taking the sealing performance of the first seal member 63 contained in the through sleeve 61 into account.

Each of the short tubes 62 is comprised of a short pipe (short line) 69 formed by cutting the connecting tube 6 to a length slightly larger than that of the through sleeve 61, and a pair of connectors 70, 70 connected to opposite ends of the short pipe 69, respectively. The pair of the connectors 70, 70 are connected to the connecting tubes 6 extending from the inside and outside of the camber room 31 via connectors 71, 71, respectively. In this case, each of the connectors 70 of the short tube 62 and an associated one of the connectors 71 of the connecting tube 6 are in the relationship of male and female connectors, and hence it is preferable to use connectors of a one-touch connection type. It should be noted that the short pipe 69 may be formed by a hard resin pipe or metal pipe in place of the silicone tube.

Figure 3B:
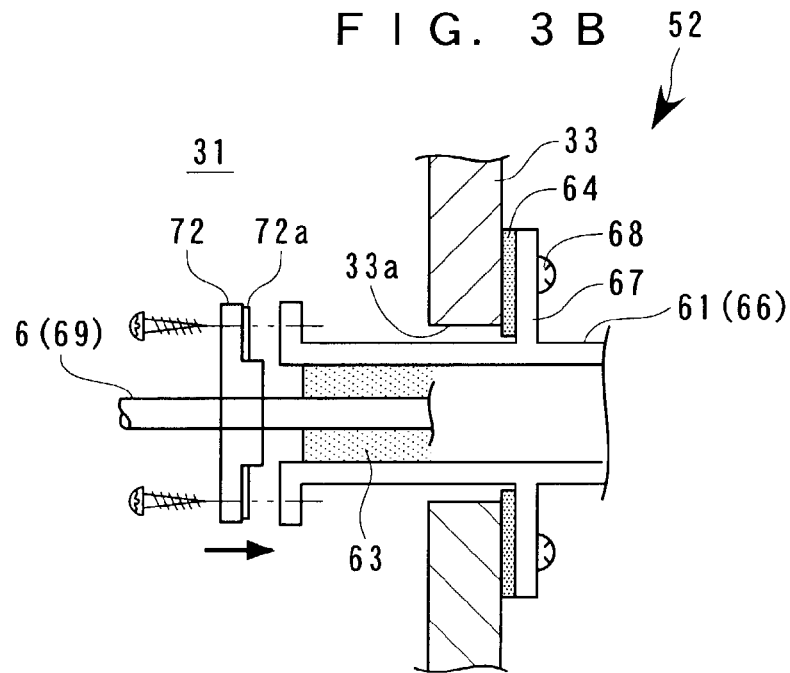

The first seal member 63 is formed of a caulking material (wet seal material), such as a silicone sealant or the like, and is injected into the through sleeve 61 having the short tube 62 inserted therein, by a caulking gun such that it fills the inside of the through sleeve 61. Further, it is more preferable that after injection of the first seal member 63, as shown in FIG. 3B, seal caps (cap members) 72 provided with sealers 72a are attached to respective opposite ends of the through sleeve 61.

The second seal member 64 is formed by an annular disk gasket (dry seal material) and is interposed between an outer surface of the wall 33 and the flange portion 67 of the through sleeve 61. More specifically, the flange portion 67 is rigidly fixed to the outer surface of the wall 33 by the fixing screws 68 in the above state of the second seal member 64 being interposed between the wall 33 and itself. It should be noted that an O ring may be used in place of the gasket.

In the piping-through unit 52 constructed as above, since the through hole 33a of the wall 33 and the connecting tube 6 (short tube 62 thereof) are sealed by the first and second seal members 63, 64 via the through sleeve 61, it is possible to enhance the sealing performance of the seal members while protecting the connecting tube 6 (short tube 62 thereof). Particularly, the first and second seal members 63, 64 are configured such that they can secure a large sealing area, and hence it is possible to reliably prevent breakage of sealing or the like, thereby making it possible to positively prevent leakage of the atmosphere and flow of water from a breakage into the chamber room 31.

Figure 4:
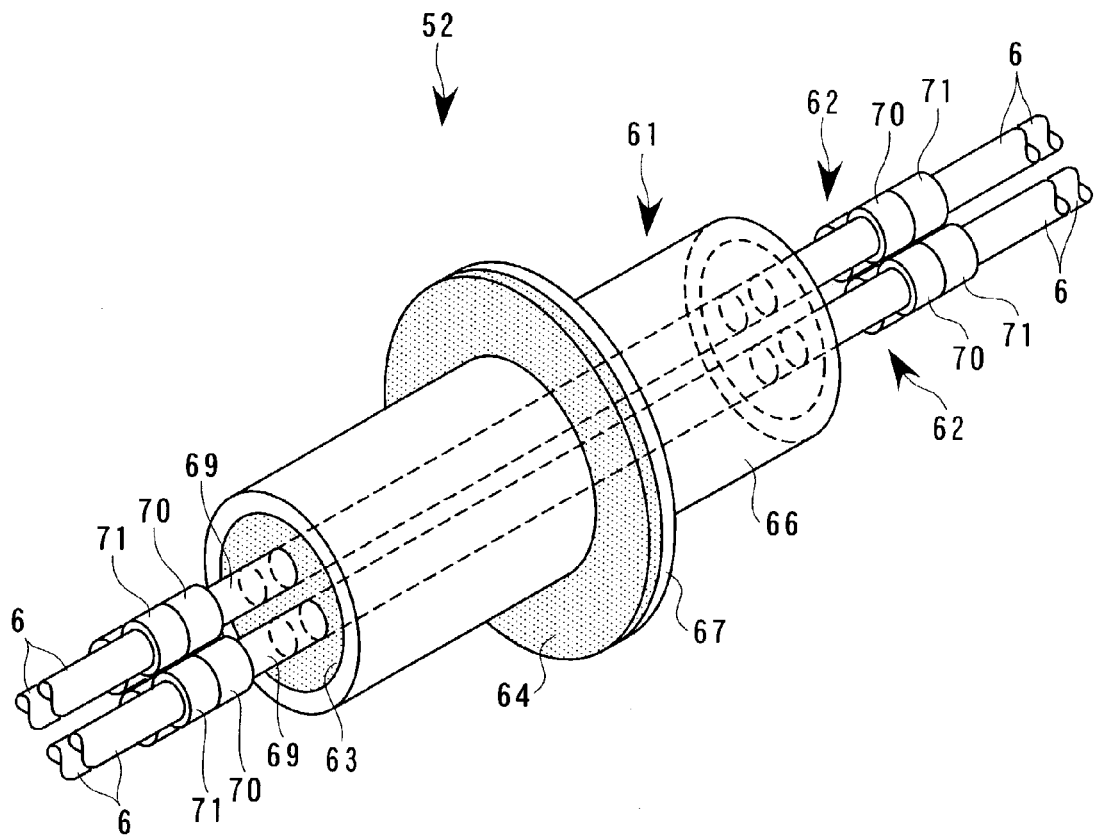
FIG. 4 is an enlarged perspective view showing a portion of the gastight chamber through which a plurality of pipes extend into the gastight chamber.

FIG. 4 shows another example of the piping-through unit 52 which has a plurality of connecting tubes 6 collectively contained in a single through sleeve 61 thereof. This piping-through unit 52 has a diameter large enough to permit the plurality of connecting tubes (plurality of short tubes 62, in this case) 6 to be inserted into the piping-through unit 52 with gaps properly separating the tubes from each other. Further, in this case, it is preferred that the through sleeve 61 contains spacers for arranging the plurality of short tubes 62 in order and/or the above seal caps 72. Further, it is preferable to affix a seal or the like to each short tube 62 for indication of the type (use) thereof.

Figure 5:
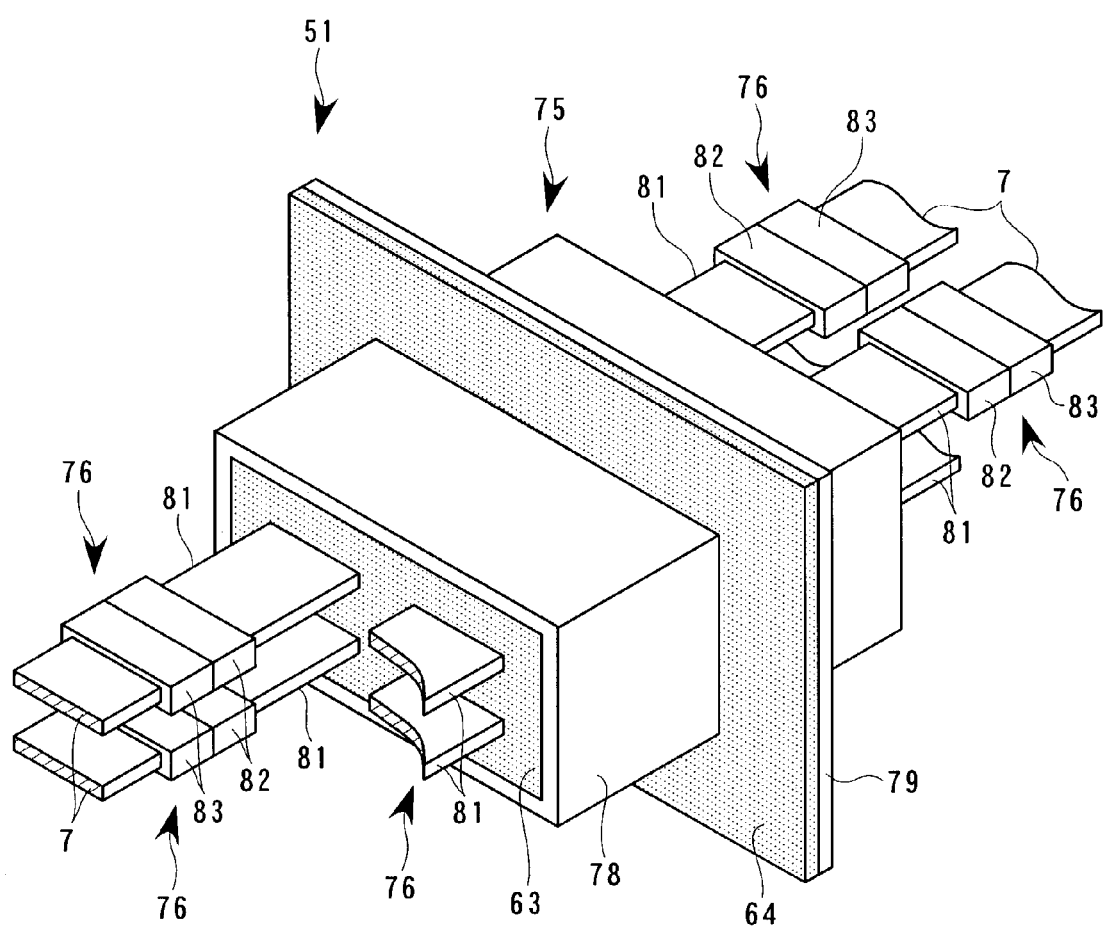
FIG. 5 is an enlarged perspective view showing a portion of the gastight chamber through which a plurality of wires (FFC) extend into the gastight chamber.

FIG. 5 shows the wiring-through unit 51 which has a plurality of connecting cables 7 collectively contained in a single through sleeve 75 thereof. This wiring-through unit 51 is comprised of a through sleeve 75 rectangular in cross section, extending through the through hole 33a formed through the wall 33, a plurality of short cables (short lines) 76 extending through the through sleeve 75 to form part of the connecting cables 7, a first seal member 63 filled in the through sleeve 75 for sealing between an inner peripheral surface of the through sleeve 75 and the plurality of short cables 76, and a second seal member 64 for sealing between an outer peripheral surface of the through sleeve 75 and the wall 33.

Similarly to the above-mentioned piping-through unit 52, the through sleeve 75 is comprised of a sleeve body 78 having the shape of a hollow rectangular prism, and a rectangular flange portion 79 integrally formed a longitudinally intermediate portion of an outer peripheral surface of the sleeve body 18. Further, the short cables 76 are each comprised of a short cable (short line) 81 formed by cutting the connecting cable 7 to a length slightly larger than that of the through sleeve 75, and a pair of connectors 82, 82 connected to opposite ends of the short cable 81. The pair of the connectors 82, 82 are connected to the connecting cables 7 extending from the inside and outside of the camber room 31 via connectors 83, respectively. In this case, each of the connectors 82, 82 of the short cable 76 and an associated one of the connectors 83 of the connecting cables 7 are in the relationship of male and female connectors.

In the wiring-through unit 51 constructed as above, similarly to the piping-through unit 52, the first and second seal members 63, 64 are configured such that they can secure a large sealing area, so that it is possible to reliably prevent breakage of sealing or the like, thereby making it possible to positively prevent leakage of the atmosphere and flow of water from a breakage into the chamber room 31. Further, in this case as well, it is preferred that the through sleeve 75 contains spacers for arranging the plurality of short cables 76 in order and/or the above seal caps 72. Further, it is preferred to affix a seal or the like to each short cables 76 for indication of the type (use) thereof. Further, although not particularly shown, connecting tubes 6 and connecting cables 7 may be contained in a single through sleeve 61 or 75.

Figure 7:
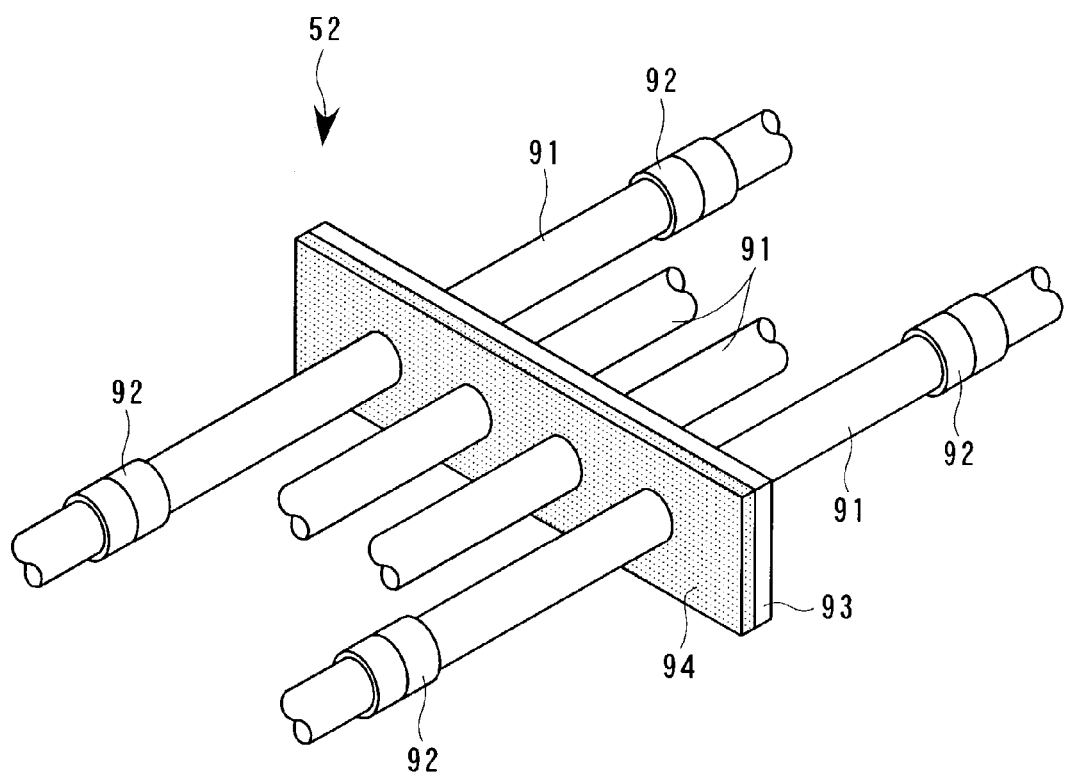
FIG. 7 is an enlarged perspective view showing a portion of the gastight chamber according to the second embodiment through which a plurality of pipes extend into the gastight chamber.

Next, another embodiment of the piping-through unit 52 will be described in detail with reference to FIGS. 6 and 7. As shown in FIG. 6, the piping-through unit 52 according to this embodiment includes a short pipe 91 extending through the wall 33, with a flow passage formed therein, a pair of connectors 92, 92 connected to respective opposite ends of the short pipe 91, a flange 93 formed on an outer peripheral surface of the short pipe 91, and a second seal member 64 interposed between the flange 93 and the wall 33. In short, the piping-through unit 52 is configured such that the short pipe 91 plays the role of the through sleeve 61 as well.

In this embodiment, although the short pipe 91 may be formed by cutting short the connecting tube 6, in view of strength of the short pipe 91, it is preferred to use a stainless pipe or a hard resin pipe. The flange 93 is integrally formed with a longitudinally intermediate portion of an outer peripheral surface of the short pipe 91. Further, similarly to the short pipe 69 in the above embodiment, the short pipe 91 has the pair of the connectors 92, 92 arranged at the opposite ends thereof for one-touch connection to the connecting tubes 6 extending from the inside and outside of the camber room 31. Further, as shown in FIG. 7, when a plurality of short pipes 91 are collectively arranged in the piping-through unit 52, a common flange 93 and a common seal member (gasket) 94 (each of which has a horizontally elongated rectangular shape) are used for the short pipes 91.

In the piping-through unit 52 constructed as above, since the short pipe 91 forming part of each connecting tube 6 also plays the role of a through sleeve, it is possible to simplify the structure for sealing (it is only necessary to provide one sealing portion), thereby making it possible to enhance the sealing performance of the seal members and the mounting workability of the piping-through unit 52. Particularly, due to one sealing portion and sealing by using a gasket, it is possible to reliably seal the wall portions of the chamber room 31 through which extend the short pipes 91.

As described hereinbefore, the ejection system 1 according to the present invention can be applied to a manufacturing method of manufacturing flat displays as well as manufacturing methods of manufacturing electronic devices and optical devices. In the following, manufacturing methods employing the ejection system 1 will be described by taking a method of manufacturing a liquid crystal display device and a method of manufacturing an organic EL device as examples. It should be noted that in the ejection system 1 applied to the method of manufacturing a liquid crystal display device, air whose temperature is controlled is introduced into the chamber room, while in the ejection system 1 applied to the method of manufacturing an organic EL device, as described above, nitrogen gas whose temperature is controlled is introduced into the chamber room.

Figure 8A:
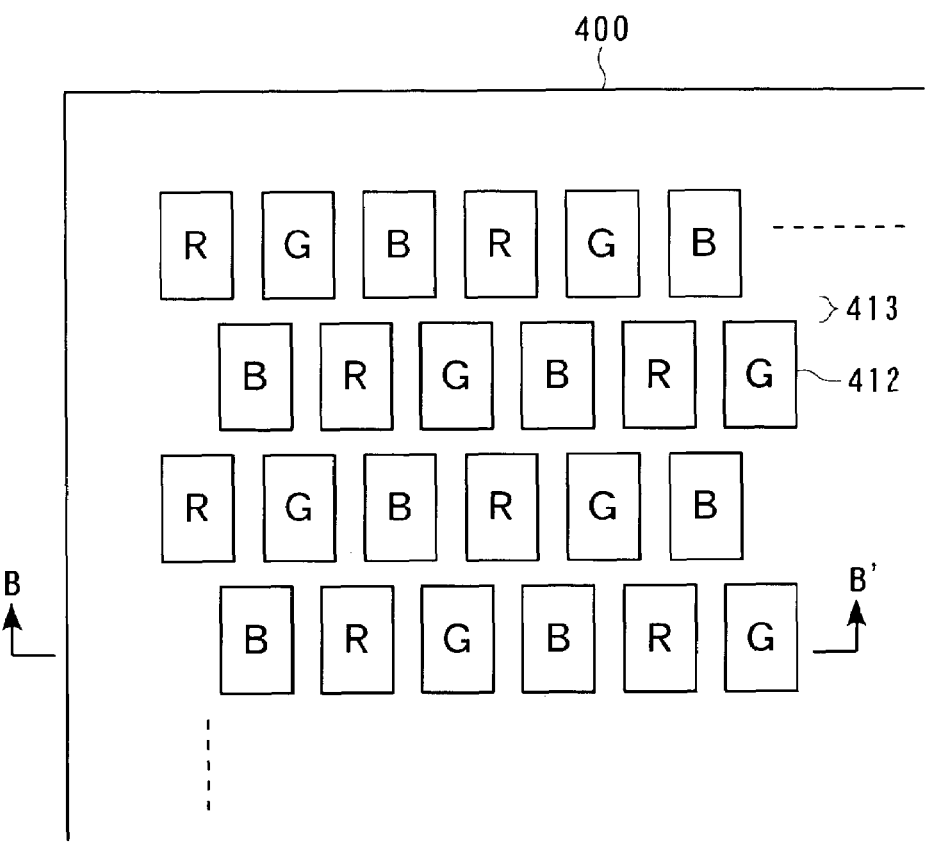
Figure 8B:
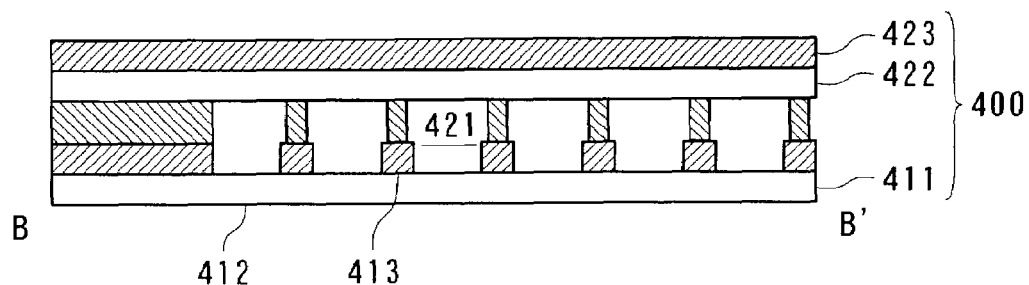

FIGS. 8A and 8B are enlarged partial views of a color filter for a liquid crystal display device. FIG. 8A is a plan view of the color filter, and FIG. 8B is a cross-sectional view of the same taken on line B-B of FIG. 8A. Hatching for showing cross-sectional portions in FIG. 8B is partially omitted.

Referring to FIG. 8A, the color filter 400 includes pixels (filter elements) 412 arrayed in the form of a matrix, and pixels are separated by partitions 413 arranged in the boundaries. To each pixel 412 is introduced one of inks (filter materials) of red (R), green (G), and blue (B). Although in this example, a so-called delta arrangement method is employed to arrange the pixels of red, green and blue, this is not limitative, but any of other suitable arrangement methods, such as a stripe arrangement method and, and a mosaic arrangement method, may be employed.

Referring to FIG. 8B, the color filter 400 includes a transparent substrate 411 and the light-shielding partitions 413. Portions where no partitions 413 are formed on the substrate 411 (where the partitions 413 are eliminated) form the above pixels 412. Inks of the colors introduced into the pixels 412 form a filter element layer 421. There are formed an overcoating layer 422 and an electrode layer 423 on upper surfaces of the partitions 413 and the filter element layer 421.

Figure 9:
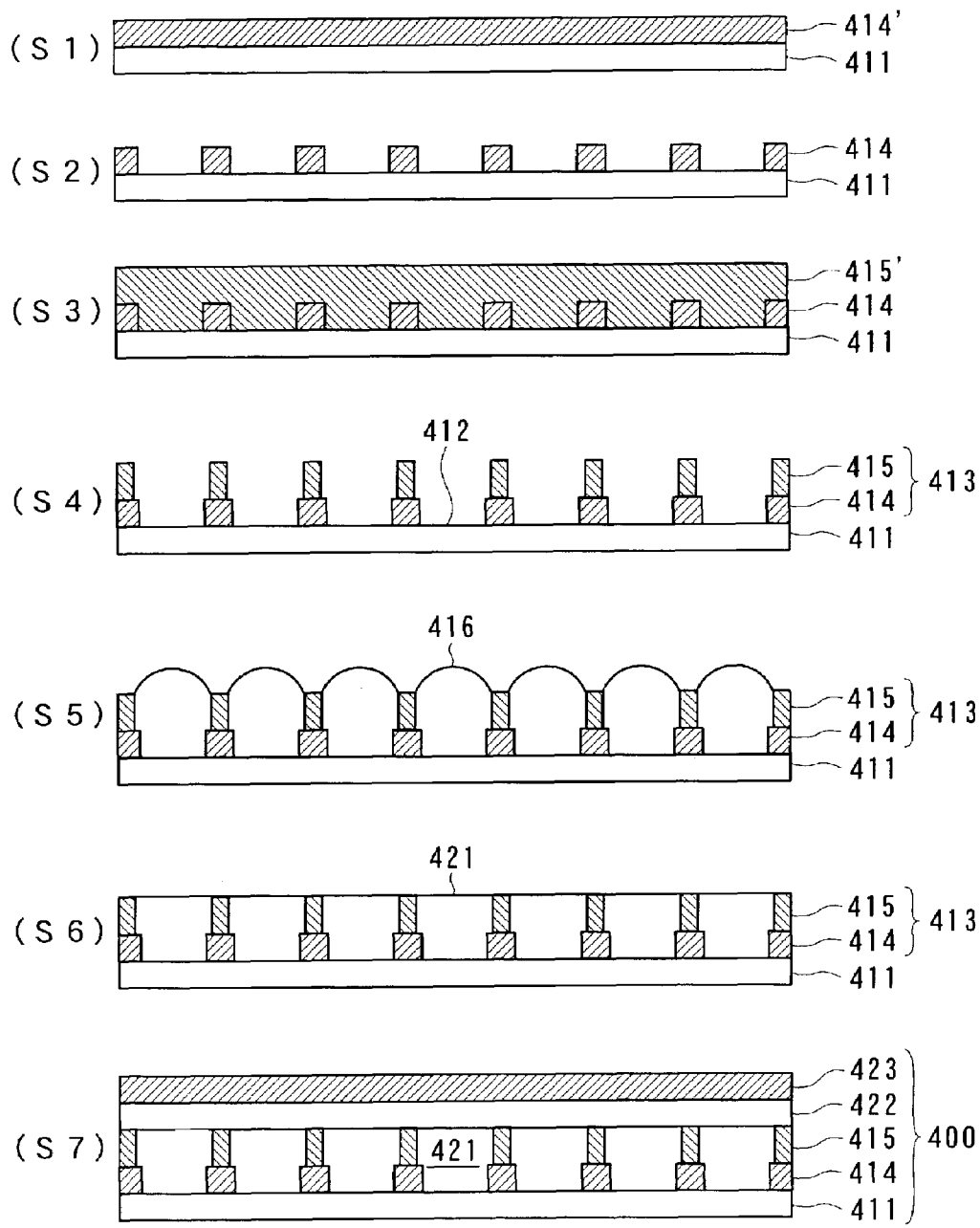
FIG. 9 provides cross-sectional views schematically showing a process of color filter being manufactured by the color filter manufacturing method according to the embodiment.

FIG. 9 provides cross-sectional views useful in explaining a process of manufacturing a color filter by the color filter manufacturing method according to the present embodiment of the invention. In the figure, hatching for showing cross-sectional portions is partially omitted.

The transparent substrate 411 is formed of non-alkali glass having a film thickness of 0.7 mm, a length of 38 cm, and a width of 30 cm. Now, the surface of the transparent substrate 411 is cleaned with a cleaning liquid prepared by adding 1 wt % of hydrogen peroxide to heated concentrated sulfuric acid. Then, after being rinsed in pure water, the surface is dried by air to obtain a clean surface, on which a chromium film having an average thickness of 0.2 μm is formed by a sputtering method, thereby obtaining a metal layer 414' (FIG. 9: S1).

The substrate is dried at 80° C. for five minutes on a hot plate, and after that a photoresist layer, not shown, is formed on the surface of the metal layer 414' by spin coating. A matrix film having a required matrix pattern drawn thereon is brought into intimate contact with the surface of the substrate, and exposed to ultraviolet rays. Then, the substrate with the matrix film is immersed in an alkaline developer containing 8 wt % of potassium hydroxide, and a photoresist of an unexposed part is removed to pattern the photoresist layer. Subsequently, the exposed metal layer is removed with an etching liquid mainly composed of hydrochloric acid. As described above, it is possible to obtain a light-shielding layer (black matrix) 414 having a predetermined matrix pattern (FIG. 9: S2). The light-shielding layer 414 has a film thickness of approximately 0.2 μm, and a trace width of approximately 22 μm.

The above substrate is further coated with a negative-type transparent acrylic photosensitive resin composition 415' by the spin coating method (FIG. 9: S3). After being pre-baked at 100° C. for 20 minutes, the substrate coated with the resin composition 415' is exposed to ultraviolet rays by using the matrix film having the predetermined matrix pattern drawn thereon. The resin of an unexposed part of the resin composition 415' is developed with an alkaline developer, and spin-dried after rinsing in pure water. The resin portion of the resin composition 415' is sufficiently cured by performing an after-baking treatment as a final drying treatment at 200° C. for 30 minutes, whereby a bank layer 415 is formed, whereby the partition 413 comprised of the light-shielding layer 414 and the bank layer 415 is formed (FIG. 9: S4). The bank layer 415 has an average film thickness of 2.7 μm, and a bank width of approximately 14 μm.

So as to improve the ink wettability to a filter element layer-forming area (especially, an exposed surface of the glass substrate 411) divided by the obtained light-shielding layer 414 and bank layer 415, dry etching, that is, a plasma treatment is carried out. More specifically, a high voltage is applied to a mixed gas produced by adding 20% of oxygen to helium, to form an etching spot in a plasma atmosphere. Then, the substrate is passed underneath the etching spot for etching.

Then, the above respective inks of R, G, and B are introduced by the ink jet method into the pixels 412 formed by dividing the filter element layer-forming area by the partition 413 (FIG. 9: S5). Precision heads making use of piezoelectric effects are used as the functional liquid droplet ejecting heads 3 (ink jet heads). Ten very small ink droplets are selectively ejected to each section of the filter element layer-forming area. The driving frequency of each head 3 is set to 14.4 kHz, that is, the time intervals of ejection of ink droplets are set to 69.5μ a seconds. The distance between each head 3 and a target of each ink is set to 0.3 mm. To attain a desired flying speed of the inks from the heads to sections of the filter element layer-forming area as targets, prevent ink droplets from being deflected in flying direction, and inhibit ink droplets from being broken up or strayed, not only the physical properties of the inks but also the waveform (of applied voltage or the like) for driving piezoelectric elements of the heads is important. Therefore, a waveform having conditions set in advance is programmed, whereby ink droplets of the three colors are simultaneously applied to the substrate to thereby coat ink in a predetermined color arrangement pattern.

As the ink filter material, there is employed one which is obtained in the following manner: After an inorganic pigment is dispersed e.g. in polyurethane resin poligomer, cyclohexanone and butyl acetate as low-boiling solvents and butyl carbitol acetate as a high-boiling solvent are added to the dispersion, and further 0.01 wt % of nonionic surfactant is added to the resulting solution as a dispersant, to form ink having a viscosity of 6 to 8 centipoise.

Next, the ink applied to the substrate is dried. First, the substrate is left as it is for 3 hours in a natural atmosphere to set an ink layer 416, then heated for 40 minutes on the hot plate of 80° C., and finally heated at 200° C. for 30 minutes in an oven, for curing the ink layer 416, whereby the filter element layer 421 can be obtained (FIG. 9: S6).

The overcoating layer 422 having a flat surface is formed on the substrate by applying a transparent acrylic resin coating material on the substrate by spin coating. Further, an electrode layer 423 made of indium tin oxide (ITO) is formed in a required pattern on an upper surface of the overcoating layer 422 to obtain a color filter 400 (FIG. 9: S7). It should be noted that overcoating layer 422 and the electrode layer 423 may be formed by a liquid droplet ejecting method of ejecting ink droplets by the functional liquid droplet ejecting heads.

Figure 10:
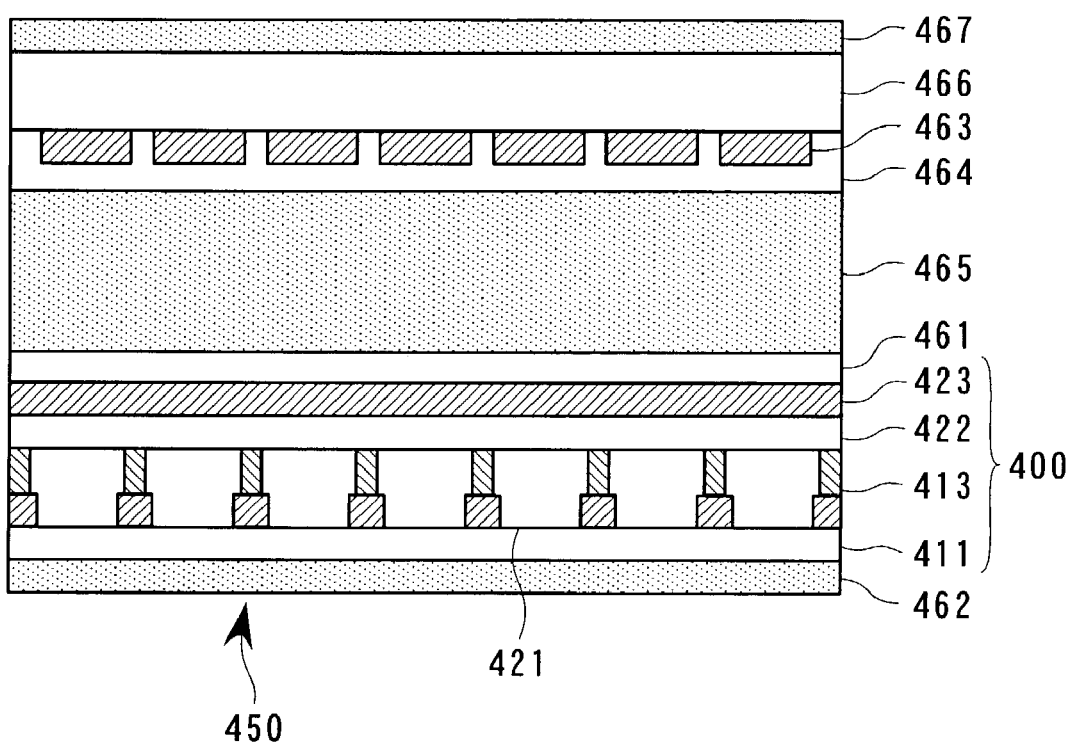
FIG. 10 is a cross-sectional view showing a liquid crystal display device manufactured by the color filter manufacturing method according to the embodiment.

FIG. 10 is a cross-sectional view of a color liquid crystal display device as an example of an electro-optic device (flat display) manufactured by the manufacturing method according to the present invention. Hatching for showing cross-sectional portions is partially omitted.

The color liquid crystal display device 450 is produced by combining the color filter 400 with a substrate 466 opposed thereto and sealing a liquid crystal composition 465 therebetween. The substrate 466, i.e. one substrate of the liquid crystal display device 450 has an inner surface thereof formed with thin film transistor (TFT) elements, not shown, and pixel electrodes 463 in the form of a matrix. Further, the color filter 400 is arranged as the other substrate such that the sections of R, G, and B of the filter element layer 421 are arranged at respective locations opposed to the pixel electrodes 463.

Respective surfaces of the substrate 466 and the color filter 400, opposed to each other, are formed with alignment layers 461, 464. The alignment layers 461, 464 are subjected to rubbing treatment and liquid crystal molecules can be arranged in a fixed direction. Further, the substrate 466 and the color filter 400 have polarizing plates 467, 462 bonded to respective outer surfaces thereof. A combination of a fluorescent light, not shown, and a scattering plate is used as a backlight, according to a general practice in this field of the art. The liquid crystal composition 465 is caused to serve as an optical shutter for changing the transmittance of light emitted from the backlight, for display.

It should be noted that the electro-optic device according to the present invention is not limited to the above color liquid crystal display device, but various types of electro-optic means, such as a small-sized television which uses a thin-model Braun tube, a liquid crystal shutter, or the like, an EL display device, a plasma display, a CRT display, and an field emission display (FED) panel, can be employed as the electro-optic device.

Next, the organic EL device (organic EL display device), and the manufacturing method for manufacturing the same will be described with reference to FIGS. 11 to 23.

FIGS. 11 to 23 show a manufacturing process for manufacturing the organic EL device including organic EL elements, and the construction of the organic EL device being produced according to the manufacturing process. The manufacturing process includes a bank portion forming process, a plasma treatment process, a light emitting element forming process including a positive hole injection/transport layer forming process and a light emitting layer forming process, an opposed electrode forming process, and a sealing process.

In the bank portion forming process, an inorganic bank layer 512a and an organic bank layer 512b are deposited sequentially at each predetermined location on a circuit element portion 502 preformed on a substrate 501, and an electrode 511 (also referred to as a "pixel electrode"), whereby a bank portion 512 formed with openings 512g is formed. As described above, the bank portion forming process includes a process for forming the inorganic bank layer 512a on the circuit element portion 502 in a manner partially overlapping the electrode 511, and a process for forming the organic bank layer 512b on the inorganic bank layer 512a.

Figure 11:
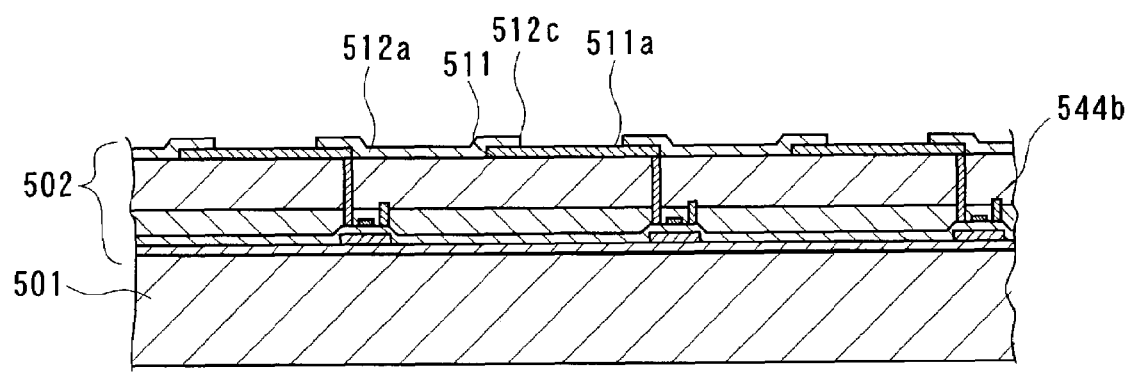
FIG. 11 is a cross-sectional view useful in explaining a process for producing bank portions (inorganic banks) by an organic EL device manufacturing method according to an embodiment of the invention.

First, as shown in FIG. 11, in the process for forming the inorganic bank layer 512a, the inorganic bank layer 512a is formed on a second interlayer-insulating film 544b of the circuit element portion 502, and the pixel electrode 511. The inorganic bank layer 512a is produced by forming an inorganic film made of SiO2, TiO2, or the like, on the second interlayer-insulating film 544b and a whole surface of the pixel electrode 511, by a chemical vapor deposition (CVD) method, the coating method, the sputtering method, a vapor deposition method, or the like.

Next, the inorganic film is patterned by etching to thereby form lower openings 512c at a location corresponding to a location where an electrode surface 511a of the electrode 511 is formed. At this time, it is necessary to form the inorganic bank layer 512a such that it overlaps a peripheral portion of the electrode 511. By forming the inorganic bank layer 512a in a manner overlapping the peripheral portion (part) of the electrode 511, as described above, it is possible to control the light emitting areas of a light emitting layer 510b (see FIGS. 20 to 23).

Figure 12:
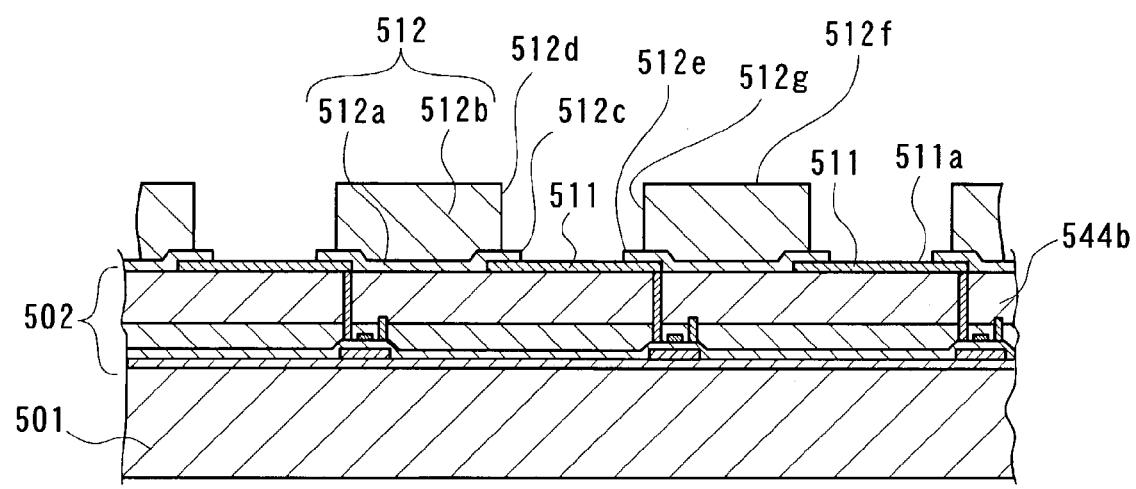
FIG. 12 is a cross-sectional view which is useful in explaining a process for producing bank portions (organic banks) by the organic EL device manufacturing method according to the embodiment.

Next, as shown in FIG. 12, in the process for forming the organic bank layer 512b, the organic bank layer 512b is formed on the inorganic bank layer 512a. The organic bank layer 512b is etched e.g. by a photo-lithographic technology to form upper openings 512d. The upper openings 512d are arranged at respective locations corresponding to the electrode surfaces 511a and the lower openings 512c.

As shown in FIG. 12, it is preferred that each upper opening 512d is formed to be wider than the lower opening 512c, and narrower than the electrode surface 511a. As a result, a first laminated portion 512e surrounding the lower opening 512c of the inorganic bank layer 512a is arranged in a manner such that it is further extended toward the center of the electrode 511 than the organic bank layer 512b. Thus, the upper opening 512d and the lower opening 512c are formed to communicate with each other, whereby an opening 512g is formed which extends through the inorganic bank layer 512a and the organic bank layer 512b.

Next, in the plasma treatment process, a region exhibiting liquid affinity and a region exhibiting liquid repellence are formed on a surface of each bank portion 512 and on the electrode surface 511a of each pixel electrode 511. This plasma treatment process is largely classified into a preheating process, a liquid affinity-imparting process for imparting the liquid affinity to an upper surface (512f) of each bank portion 512, wall surfaces of each opening 512g, and the electrode surface 511a of each pixel electrode 511, a liquid repellence-imparting process for imparting the liquid repellence to the upper surface 512f of each organic bank layer 512b, and wall surfaces of each upper opening 512d, and a cooling process.

First, in the preheating process, the substrate 501 including the bank portions 512 is heated to a predetermined temperature. The heating is carried out by attaching a heater to a stage on which the substrate 501 is placed and heating the substrate 501 together with the stage by the heater. More specifically, it is preferable to preheat the substrate 501 at a temperature between 70 and 80° C., for instance.

Figure 13:
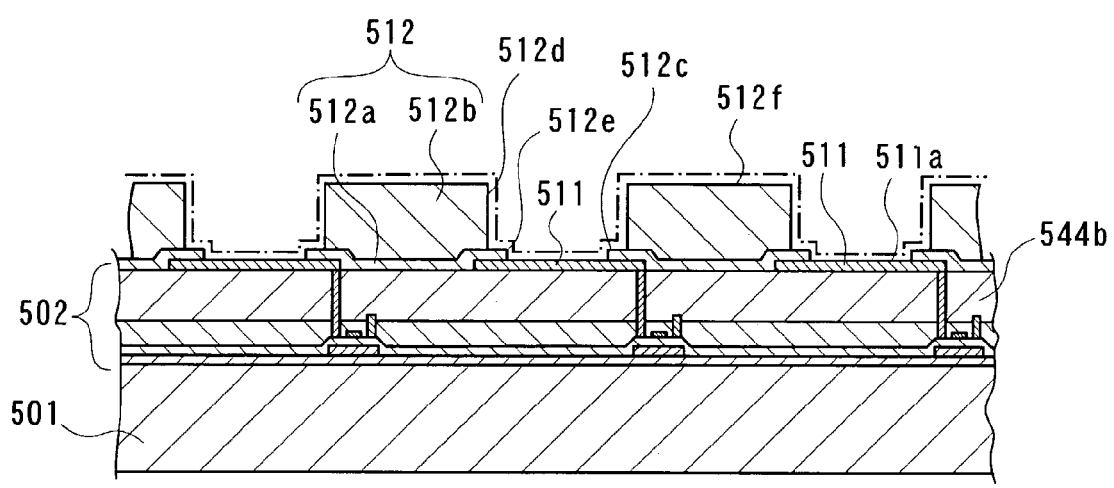
FIG. 13 is a cross-sectional view useful in explaining a plasma treatment process (liquid affinity-imparting process) in the organic EL device manufacturing method according to the embodiment.

Then, in the liquid affinity-imparting process, a plasma treatment ($O_2$ plasma treatment) is carried out by using oxygen as a process gas in the air atmosphere. As shown in FIG. 13, by this O₂ plasma treatment, the liquid affinity treatment is effected on the electrode surface 511a of each pixel electrode 511, the first laminated portions 512e of the inorganic bank layer 512a, and the wall surfaces of each upper opening 512d and the upper surfaces 512f of the organic bank layer 512b. The liquid affinity treatment introduces hydroxyl groups into the above respective surfaces, thereby imparting the liquid affinity thereto. In FIG. 13, portions having been subjected to the liquid affinity treatment are indicated by one-dot-chain lines.

Figure 14:
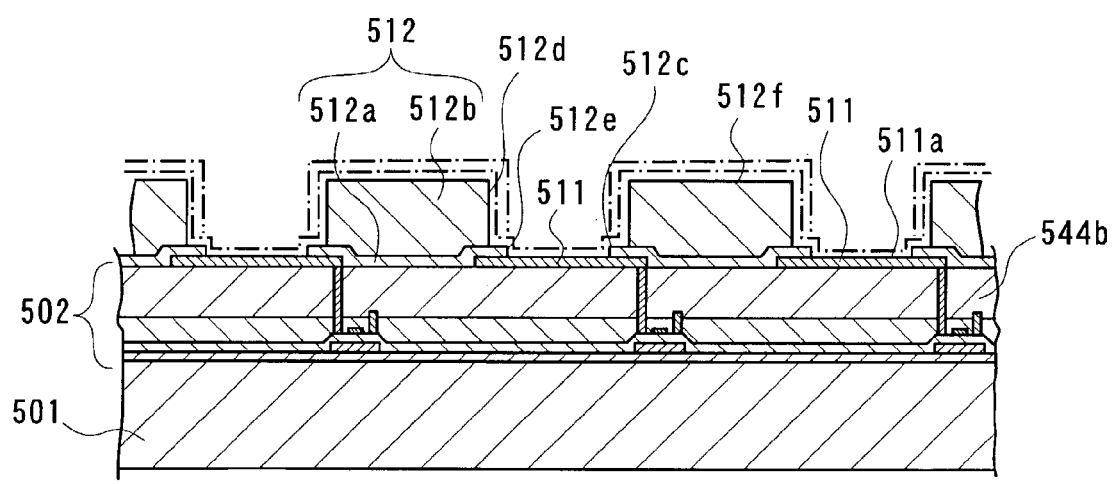
FIG. 14 is a cross-sectional view useful in explaining the plasma treatment process (liquid repellence-imparting process) in the organic EL device manufacturing method according to the embodiment.

Next, in the liquid repellence-imparting process, a plasma treatment (CF₄ plasma treatment) is carried out by using tetrafluoromethane as a process gas in the air atmosphere. As shown in FIG. 14, by this CF₄ plasma treatment, the liquid repellence treatment is effected on the wall surface of the upper openings 512d, and the upper surfaces 512f of the organic bank layer 512b. The liquid repellence treatment introduces fluorine groups into the above respective surfaces, thereby imparting the liquid repellence thereto. In FIG. 14, regions exhibiting the liquid repellence are indicated by two-dot chain lines.

Next, in the cooling process, the temperature of the substrate 501 heated for the plasma treatments is lowered to a room temperature or a controlled temperature for an ink jet process (functional liquid droplet ejecting process). By lowing the temperature of the substrate 501 subjected to the plasma treatments to the room temperature or a predetermined temperature (controlled temperature for execution of the ink jet process), it is possible to execute the subsequent positive hole injection/transport layer forming process at a constant temperature.

Next, in the light emitting element forming process, a light emitting element is formed by forming a positive hole injection/transport layer and a light emitting layer on each pixel electrode 511. The light emitting element forming process includes four processes: a first functional liquid droplet ejecting process for ejecting a first composition required for forming the positive hole injection/transport layer, onto the pixel electrodes, the positive hole injection/transport layer forming process for drying the ejected first composition to form the positive hole injection/transport layer on the pixel electrodes, a second functional liquid droplet ejecting process for ejecting a second composition required for forming the light emitting layer, onto the positive hole injection/transport layer, and the light emitting layer forming process for drying the ejected second composition to form the light emitting layer on the positive hole injection/transport layer.

First, in the first functional liquid droplet ejecting process, the first composition containing a hole injection/transport layer forming material is ejected onto each electrode surface 511a by the functional liquid droplet ejecting method. It should be noted that the first functional liquid droplet ejecting process and the following processes are preferably carried out in the inert gas atmosphere, such as a nitrogen gas atmosphere, an argon gas atmosphere or the like, which contains no water nor oxygen. (Further, when the positive hole injection/transport layer is formed only on the pixel electrodes, no positive hole injection/transport layer is formed adjacent to the organic bank layer).

Figure 15:
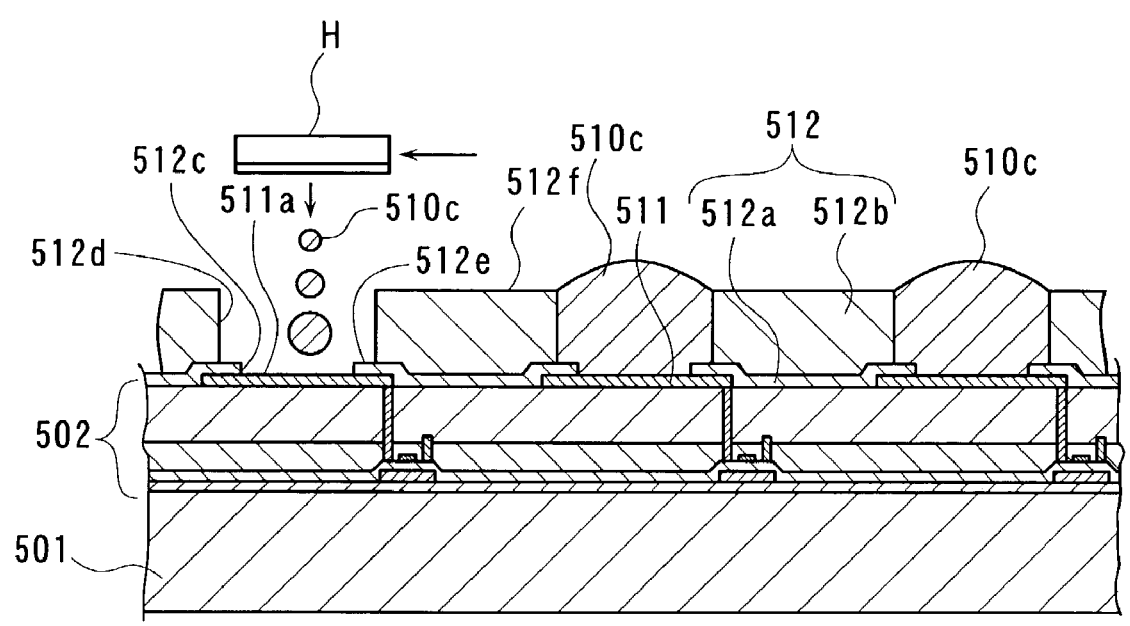
FIG. 15 is a cross-sectional view useful in explaining a positive hole injection/transport layer forming process (functional liquid droplet ejecting process) in the organic EL device manufacturing method according to the embodiment.

As shown in FIG. 15, the first composition containing the hole injection/transport layer forming material is filled in a functional liquid droplet ejecting head H, each nozzle of the head H is caused to face toward the electrode surface 511a located in the lower opening 512c, and droplets 510c, each in a controlled amount, of the first composition are ejected from the nozzles onto the electrode surface 511a, while moving the head H and the substrate 501 relative to each other.

As the first composition employed in this process, there may be used, for instance, a composition obtained by dissolving a mixture of a polythiophene derivative, such as polyethylenedioxythiophene (PEDOT), and polystyrenesulfonic acid (PSS), in a polar solvent. As the polar solvent, there may be mentioned, for instance, isopropyl alcohol (IPA), normal butanol, γ-butylolactone, N-methylpyrrolidone (NMP), 1,3-dimethyl-2-imidazolidinone (DMI) and derivatives thereof, and glycol ethers, such as carbitol acetate and butyl carbitol acetate. It should be noted that the same material may be used for the respective light emitting layers 510b of R, G, and B as the hole injection/transport layer forming material, or alternatively different materials may be used therefor.

As shown in FIG. 15, the ejected droplets 510c of the first composition spread over the electrode surface 511a and the first laminated portion 512e having been subjected to the liquid affinity treatment, and fill the lower and upper openings 512c, 512d. The amount of the first composition ejected onto the electrode surface 511a is determined depending e.g. on the sizes of the lower and upper openings 512c, 512d, the thickness of the positive hole injection/transport layer to be formed, and the concentration of the hole injection/transport layer forming material in the first composition. Further, the droplets 510c of the first composition may be ejected onto the same electrode surface 511a not only by a single operation but also a plurality of separate operations.

Figure 16:
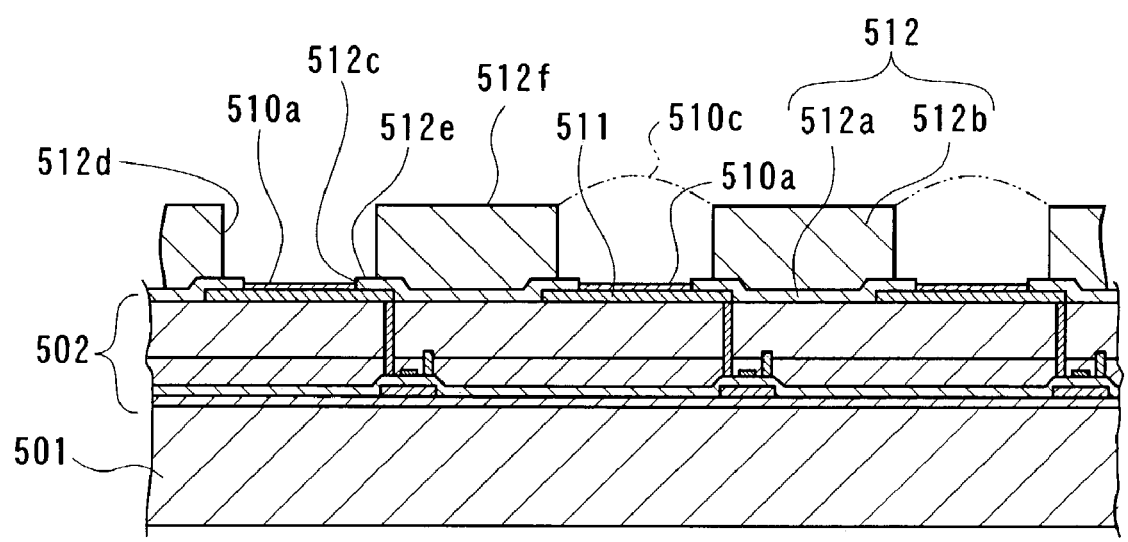
FIG. 16 is a cross-sectional view useful in explaining the positive hole injection/transport layer forming process (drying treatment) in the organic EL device manufacturing method according to the embodiment.

Next, as shown in FIG. 16, in the positive hole injection/transport layer forming process, the first composition ejected is subjected to drying and heating treatments for evaporating the polar solvent contained in the first composition, whereby a positive hole injection/transport layer 510a is formed (more specifically, individual portions or sections of the layer 510a are formed; similar wording is applied throughout the specification when considered appropriate) on the electrode surface 511a. When the drying treatment is performed, there occurs evaporation of the polar solvent contained in the droplets 510c of the first composition, at a location close to the inorganic bank layer 512a and the organic bank layer 512b, and in accordance with the evaporation, the hole injection/transport layer forming material is concentrated for precipitation.

As shown in FIG. 16, the above drying treatment also causes evaporation of the polar solvent on the electrode surface 511a, whereby a flat portion 510a of the hole injection/transport layer forming material is formed on the electrode surface 511a. Since the evaporating speed of the polar solvent is approximately uniform on the electrode surface 511a, the hole injection/transport hole injection/transport layer forming material is approximately uniformly concentrated on the electrode surface 511a to thereby form a flat portion 510a having a uniform thickness.

Next, in the second functional liquid droplet ejecting process, the second composition containing a light emitting layer forming material is ejected onto the positive hole injection/transport layer 510a by the functional liquid droplet ejecting method. In this process, to prevent redissolution of the positive hole injection/transport layer 510a, a nonpolar solvent insoluble to the positive hole injection/transport layer 510a is employed as a solvent for solving the second composition used in forming the light emitting layer.

However, the positive hole injection/transport layer 510a has a low affinity to a nonpolar solvent, and hence even if the second composition containing the nonpolar solvent is ejected onto the positive hole injection/transport layer 510a, there is a fear that the positive hole injection/transport layer 510a and the light emitting layer 510b cannot be brought into intimate contact with each other, or the light emitting layer 510b cannot be uniformly coated on the positive hole injection/transport layer 510a. Therefore, to increase the affinity of the surface of the positive hole injection/transport layer 510a to the nonpolar solvent and the light emitting layer forming material, it is preferred to carry out a surface modification process before the light emitting layer is formed.

Now, first, the surface modification process will be described hereinafter. In this process, a surface modification solvent, which is the same solvent or the same type of solvent as the nonpolar solvent for solving the second composition used in forming the light emitting layer, is coated on the positive hole injection/transport layer 510a by the functional liquid droplet ejecting method, the spin coating method, or a dipping method, and then dried.

Figure 17:
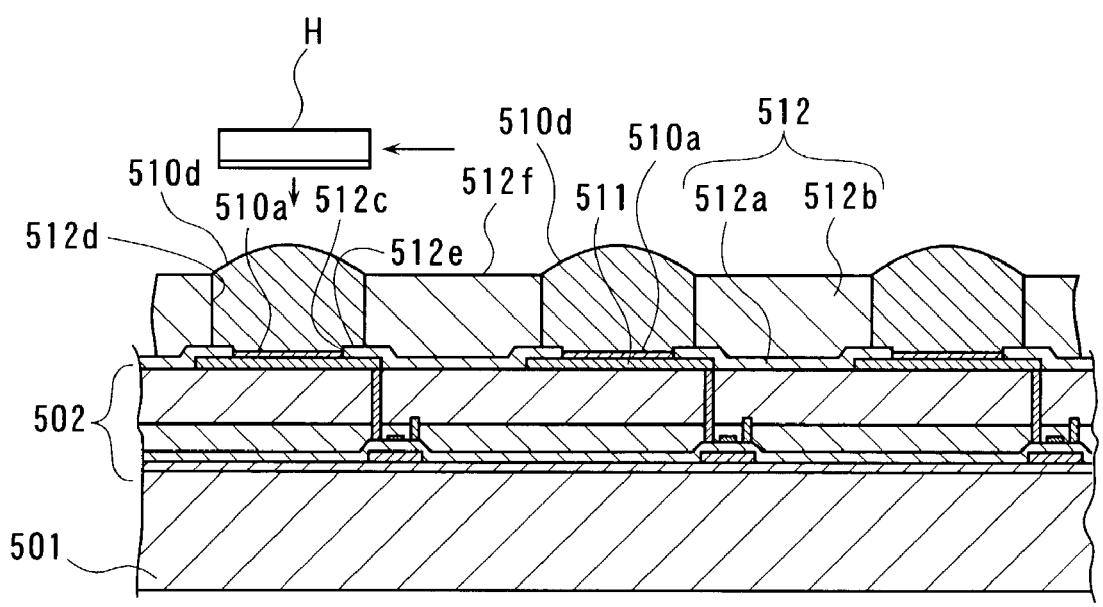
FIG. 17 is a cross-sectional view useful in explaining a surface modification process (functional liquid droplet ejecting process) in the organic EL device manufacturing method according to the embodiment.

For instance, as shown in FIG. 17, coating by the functional liquid droplet ejecting method is carried out by filling the surface modification solvent in the functional liquid droplet ejecting head H, causing the nozzles of the head H to face toward the substrate (i.e. substrate formed with the positive hole injection/transport layer 510a), and ejecting the surface modification solvent 510d onto the positive hole injection/transport layer 510a from the nozzles, while moving the head H and the substrate 501 relative to each other. After that, as shown in FIG. 18, the surface modification solvent 510d is dried.

Figure 19:
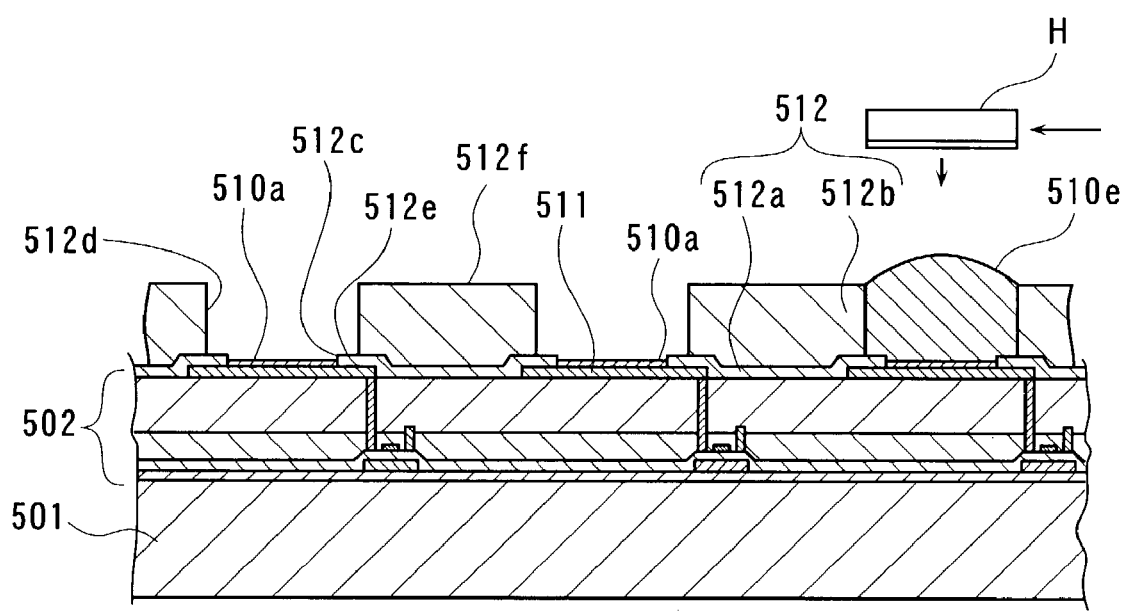
FIG. 19 is a cross-sectional view useful in explaining a B light emitting layer forming process (functional liquid droplet ejecting process) in the organic EL device manufacturing method according to the embodiment.

Next, in the second functional liquid droplet ejecting process, the second composition containing the light emitting layer forming material is ejected onto the positive hole injection/transport layer 510a by the functional liquid droplet ejecting method. As shown in FIG. 19, the second composition containing a blue (B) light emitting layer forming material is filled in the head H, the nozzles of the head H are caused to face toward sections of the positive hole injection/transport layer 510a located with the lower openings 512c and droplets 510e, each in a controlled amount, of the second composition are ejected from the nozzles onto the positive hole injection/transport layer 510a, while moving the head H and the substrate 501 relative to each other.

As the light emitting layer forming material, there may be used a polyfluorene-based polymer derivative, a (poly)paraphenylenevinylene derivative, a polyphenylene derivatives, polyvinyl carbazole, a polythiophene derivative, a perylene-based dye, a coumarin-based dye, a rhodamine-based dye, or a material obtained by doping any of the above polymer compounds with an organic EL material. For instance, the above polymer compounds can be used by doping the same with rubrene, perylene, 9,10-diphenylanthracene, tetraphenyl butadiene, Nile red, coumarin 6, quinacridone, or the like.

As nonpolar solvents, it is preferable to use solvents insoluble to the positive hole injection/transport layer 510a, such as cyclohexylbenzene, dihydrobenzofuran, trimethylbenzene, tetramethylbenzene, and the like. By using any of the above nonpolar solvents for solving the second composition used in forming the light emitting layer 510b, it is possible to coat the second composition on the positive hole injection/transport layer 510a without redissolving the same.

Referring to FIG. 19, the ejected second composition 510e spread over the positive hole injection/transport layer 510a to fill the lower and upper openings 512c, 512d. The second composition 510e may be ejected onto the same positive hole injection/transport layer 510a not by a single operation but by a plurality of separate operations. In the latter case, the same amount of the second composition 510e may be ejected each time, or alternatively a different amount of the second composition 510e may be ejected each time.

Figure 20:
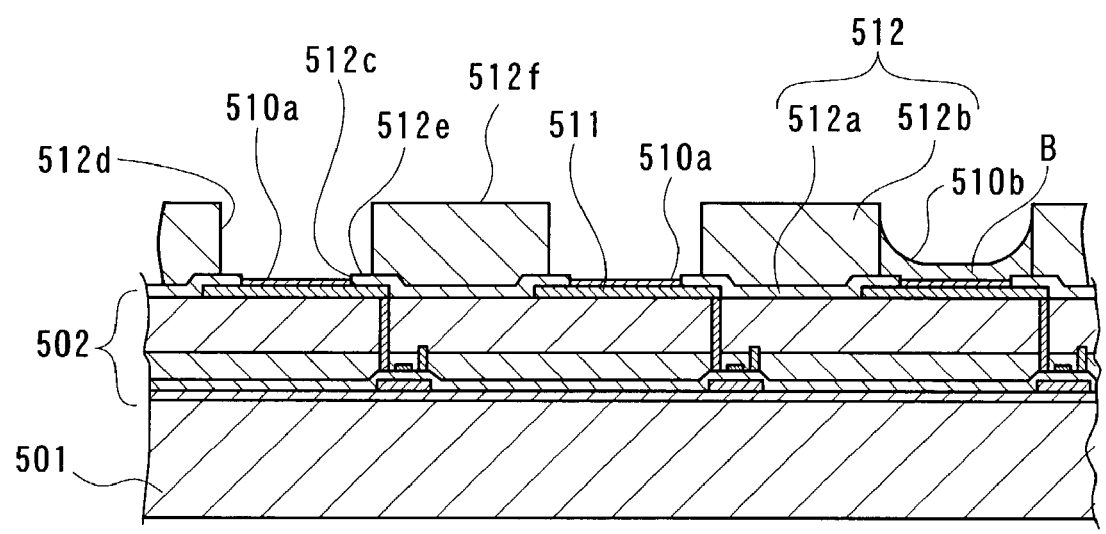
FIG. 20 is a cross-sectional view useful in explaining the B light emitting layer forming process (drying treatment) in the organic EL device manufacturing method according to the embodiment.

Next, in the light emitting layer forming process, after the second composition is ejected, it is subjected to drying and heating treatments to form the light emitting layer 510b on the positive hole injection/transport layer 510a. The drying treatment causes the nonpolar solvent contained in the ejected second composition to be evaporated, whereby a blue (B) light emitting layer 510b, is formed, as shown in FIG. 20.

Successively, as shown in FIG. 21, similarly to the case of the blue (B) light emitting layer 510b, a red (R) light emitting layer 510b is formed, and finally a green (G) light emitting layer 510b is formed. It should be noted that the order of forming of the light emitting layers 510b is not limited to the mentioned order, but the layers may be formed in any order. For instance, it is possible to determine the order of forming them depending on the materials used for forming them.

Figure 22:
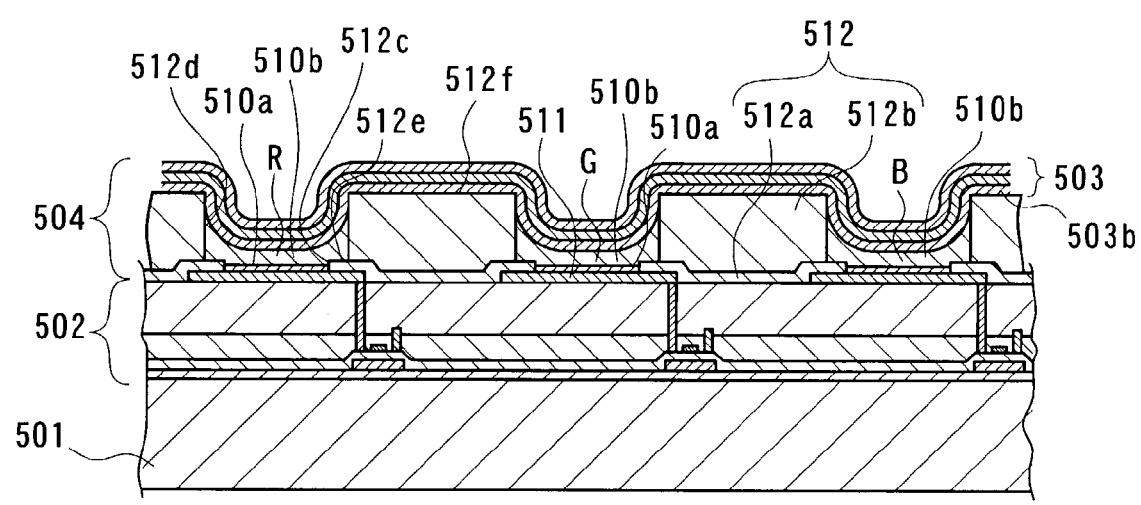
FIG. 22 is a cross-sectional view useful in explaining an opposed electrode forming process in the organic EL device manufacturing method according to the embodiment.

Next, as shown in FIG. 22, in the opposed electrode forming process, a cathode (opposed electrode) 503 is formed on all the surfaces of the light emitting layer 510b and the organic bank layer 512b. It should be noted that the cathode 503 may be formed by depositing a plurality of layers of materials. For instance, it is preferred that a layer of a material having a lower work function is formed toward the light emitting layer. In this case, for instance, it is possible to use Ca, Ba, or the like. Further, it may be preferable to form a thin LiF film on a lower layer depending on the material. Further, it is preferred that a material having a higher work function is used on an upper side (sealing side) than on a lower side. It is preferable to form the above cathodes (cathode layers) 503 e.g. by the vapor deposition method, the sputtering method, or the CVD method. Especially, it is preferable to form them by the vapor deposition method since damage to the light emitting layers 510b by heat can be prevented.

Further, a lithium fluoride cathode layer may be formed only on the light emitting layer 510b. Further, it may be formed only on the blue (B) light emitting layer 510b. In this case, the other layers, that is, the red (R) light emitting layer 510b and the green (G) light emitting layer 510b are adjacent to an upper cathode layer 503b made of LiF. Further, it is preferable to form an Al layer, an Ag layer or the like on the upper surface of the cathode 503 by the vapor deposition method, the sputtering method, or the CVD method. Furthermore, on the cathode 503, there may be formed a protective layer made of $SiO_2$, SiN, etc. for prevention of oxidation.

Figure 23:
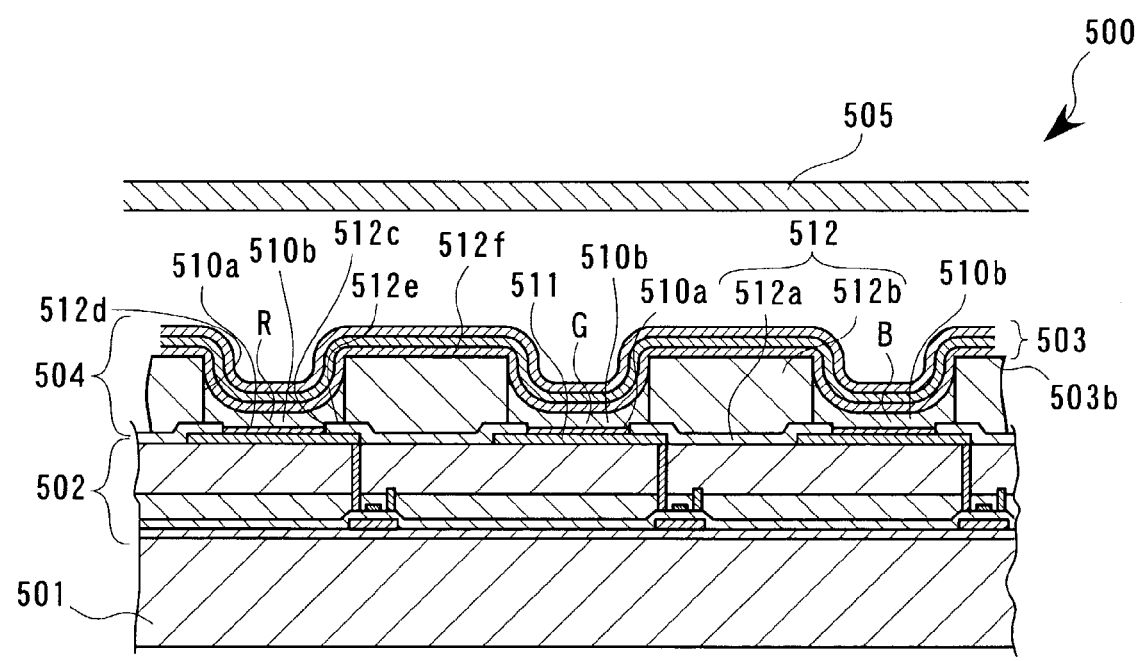
FIG. 23 is a cross-sectional view useful in explaining a sealing process in the organic EL device manufacturing method according to the embodiment.

Finally, in the sealing process shown in FIG. 23, a sealing substrate is deposited upon an organic EL device 504 in the atmosphere of inert gas, such as nitrogen gas, argon gas, helium gas, or the like. It is preferable to carry out the sealing process in the above inert gas atmosphere. It is not preferable to carry out the sealing process in the air atmosphere, since when the sealing process is performed in the air atmosphere, if the cathode 503 has a defect, such as a pin hole, formed therein, there is a fear that water, oxygen, or the like enters the cathode 503 from the defect to oxidize the cathode 503. Finally, the cathode 503 is connected to the wiring of a flexible board, and the wiring of the circuit element portion 502 is connected to a driving IC, whereby an organic EL device 500 according to the present embodiment is obtained.

It should be noted that in forming the pixel electrode 511 and the cathode (opposed electrode) 503, the functional liquid droplet ejecting method may be employed by using the functional liquid droplet ejecting head H. More specifically, electrode materials in a liquid form are introduced into the functional liquid droplet ejecting heads H, respectively, and the pixel electrode 511 and cathode 503 are formed, respectively, by ejecting the electrode materials from the respective heads H (this method includes a drying process).

Similarly, the functional liquid droplet ejecting apparatus 2 according to the present embodiment can be applied to a method of manufacturing an electron emitting device, a method of manufacturing a PDP (Plasma Display Panel) device, and a method of manufacturing an electrophoresis display device.

In the method of manufacturing an electron emitting device, fluorescent materials for forming phosphors that emit fluorescent light of the colors R, G, and B are introduced into a plurality of functional liquid droplet ejecting heads 3, and while moving the plurality of heads 3 for main scanning and sub scanning, the fluorescent materials are selectively ejected from the heads 3 to thereby form a lot of phosphors on electrodes. It should be noted that the electron emitting device is a superordinate concept including an FED (Field Emission Display).

In the method of manufacturing a PDP device, fluorescent materials for forming phosphors that emit fluorescent light of the colors R, G, and B are introduced into a plurality of functional liquid droplet ejecting heads 3, and while moving the plurality of heads 3 for main scanning and sub scanning, the fluorescent materials are selectively ejected from the heads 3 to thereby form phosphors in a large number of respective concave portions of a back substrate.

In the method of manufacturing an electrophoresis display device, materials for forming migration elements of the colors R, G, and B are introduced into a plurality of functional liquid droplet ejecting heads 3, and while moving the plurality of heads 3 for main scanning and sub scanning, the materials are selectively ejected from the heads 3 to thereby form migration elements in a large number of respective concave portions of electrodes. It should be noted that a migration element is comprised of an electrically charged particle and a dye, and is preferably enclosed in a microcapsule.

On the other hand, the functional liquid droplet ejecting apparatus 2 according to the present embodiment can also be applied to a spacer forming method, a metal wiring forming method, a lens forming method, a resist forming method, and a light diffuser forming method.

The spacer forming method is employed for forming a large number of particulate spacers to form very small cell gaps between two substrates. A material for forming the spacers, which is prepared in a liquid form by dispersing a particle material in a liquid, is introduced into a plurality of functional liquid droplet ejecting heads 3, and while moving the plurality of heads 3 for main scanning and sub scanning, the material is selectively ejected from the heads 3 to thereby form the spacers on at least one of the two substrates. For instance, the spacer forming method is useful in forming cell gaps between two substrates in the liquid crystal display device and the electrophoresis display device, described above. It goes without saying that the spacer forming method can be applied to techniques of manufacturing semiconductor devices which require very small gaps of the above-mentioned kind.

In the metal wiring forming method, a metal material in a liquid form is introduced into a plurality of functional liquid droplet ejecting heads 3, and while moving the plurality of heads 3 for main scanning and sub scanning, the metal material in the liquid form is selectively ejected from the heads 3 to thereby form metal wiring on a substrate. The metal wiring forming method can be employed to form, for instance, metal wiring connecting between a driver and electrodes of the above liquid crystal display device, and metal wiring connecting between TFTs or the like and electrodes of the above organic EL device. Further, it goes without saying that the metal wiring forming method can be applied not only to production of the flat displays of the above-mentioned kinds but also to the general semiconductor manufacturing technique of.

In the lens forming method, a lens material is introduced into a plurality of functional liquid droplet ejecting heads 3, and while moving the plurality of heads 3 for main scanning and sub scanning, the lens material is selectively ejected from the heads 3 to thereby form a lot of microlenses on a transparent substrate. The lens forming method can be applied e.g. to a beam converging device in the above FED device. Of course, the method can be allied to various optical devices.

In the resist forming method, a resist material is introduced into a plurality of functional liquid droplet ejecting heads 3, and while moving the plurality of heads 3 for main scanning and sub scanning, the resist material is selectively ejected from the heads 3 to thereby form a photoresist having a desired shape on a substrate. The resist forming method can be widely applied, for instance, to the coating of a photoresist necessitated in a photo-lithographic method which forms a major portion of the semiconductor manufacturing technique, let alone to the forming of banks in the above display devices.

In the light diffuser forming method for forming a large number of light diffusers on a board, a light diffusing material is introduced into a plurality of functional liquid droplet ejecting heads 3, and while moving the plurality of heads 3 for main scanning and sub scanning, the light diffusing material is selectively ejected from the heads 3 to thereby form a large number of light diffusers. Needless to say, this method as well can be applied to various optical devices.

According to the through structure of the connecting lines in the gastight chamber of the present invention, the connecting lines are configured to extend through the through sleeve such that the connecting lines and the wall of the gastight chamber are sealed via the first and second seal members arranged inside and outside the through sleeve. Therefore, it is possible to enhance the sealing performance of the wall (through hole) and the connecting lines, thereby making it possible to positively prevent leakage of the atmosphere from the gastight chamber and flow of water into the same.

Similarly, the short pipe which forms part of the piping is formed with the flange and the through sleeve is directly attached to the wall (fitted in the through hole thereof) of the gastight chamber via the seal member. Therefore, it is possible to simplify the through structure to positively prevent leakage of the atmosphere from the gastight chamber and flow of water into the same.

Further, according to the ejection system of the present invention, it is possible to positively prevent leakage of the inner atmosphere in the gastight chamber from a wall portion through which the short pipe extends into the chamber. Therefore, a high-quality work can be obtained by work processing, and at the same time it is possible to positively prevent environmental pollution and the like caused by the leakage of the inner atmosphere. This makes it possible to provide a system with high reliability and safety.

According to the liquid crystal display device manufacturing method, the organic EL device manufacturing method, the electron emitting device manufacturing method, the PDP device manufacturing method, and the electrophoresis display device manufacturing method, of the present invention, the controlled stable atmosphere makes it possible to prevent changes in quality of the filter materials and light emitting materials used in the above devices, and hence the manufacturing efficiency can be enhanced.

Further, according to the color filter manufacturing method, the organic EL manufacturing method, the spacer forming method, the metal wiring forming method, the lens forming method, the resist forming method, and the light diffuser forming method, of the present invention, the controlled and stable atmosphere makes it possible to prevent changes in quality of the filter materials and light emitting materials used in the electronic devices and the optical devices, and hence the manufacturing efficiency of the devices can be enhanced.

It is further understood by those skilled in the art that the foregoing are preferred embodiments of the invention, and that various changes and modifications may be made without departing from the spirit and scope thereof.

What is claimed is:

1. A through structure of a connecting line extending through a wall of a gastight chamber, the connecting line being formed by at least one of piping and wiring for connecting a work processing apparatus contained in the gastight chamber and accessories for the work processing apparatus, the through structure comprising:

a through sleeve extending through the wall, with the connecting line extending through the through sleeve, the through sleeve including a hollow cylindrical sleeve body, a flange portion formed on an outer peripheral surface of the sleeve body, the flange portion being rigidly fixed to a surface of the wall on the outside of the gastight chamber, the connecting line including a short line extending through said through sleeve and being formed to have a length slightly larger than that of said through sleeve, and a pair of one-touch connection type connector members connected to opposite ends of said short line;

a first seal member filled in the through sleeve and extending throughout the length of the through sleeve, for sealing between the through sleeve and the connecting line; and a second seal member for sealing between the through sleeve and the wall, the second seal member being interposed over an entire face of contact between the flange portion and the wall.

2. The through structure according to claim 1, wherein said first seal member is formed of a wet seal material, and said second seal member is formed of a dry seal material.

3. The through structure according to claim 2, wherein said through sleeve has cap members with sealers attached to opposite ends thereof, respectively.

4. An ejection system comprising:
a gastight chamber;
a work processing apparatus contained in said gastight chamber;
accessories for said work processing apparatus;
a connecting line formed by at least one of piping and wiring for connecting said work processing apparatus and said accessories; and a through structure of said connecting line extending into said gastight chamber, including:

a through sleeve extending through a wall, with said connecting line extending through said through sleeve, the connecting line having a pair of one-touch connection type connector members connected to opposite ends of the connecting line;

a flange formed on an outer peripheral surface of the through sleeve, the flange being rigidly fixed to a surface of the wall on the outside of the gastight chamber;

a first seal member filled in said through sleeve and extending throughout the length of the through sleeve, for sealing between said through sleeve and said connecting line, and a second seal member interposed over an entire face of contact between the flange and the wall, wherein said work processing apparatus is a liquid droplet ejecting apparatus that has a functional liquid droplet ejecting head into which functional liquids are introduced, and that selectively ejects functional liquid droplets onto a substrate as a work, while causing said functional liquid droplet ejecting head to scan relative to the substrate.

5. A method of manufacturing a liquid crystal display device, by using the ejection system according to claim 4, the liquid crystal display device having filter elements formed on a substrate of a color filter thereof, the method comprising the steps of: introducing a filter material into said functional liquid droplet ejecting head;

and forming the filter elements by causing said functional liquid droplet ejecting head to scan relative to the substrate and selectively eject the filter material.

6. A method of manufacturing an organic EL device, by using the ejection system according to claim 4, the organic EL device having EL light emitting layers formed on pixels on a substrate thereof, the method comprising the steps of:

introducing light emitting materials of colors into said functional liquid droplet ejecting head; and forming the EL light emitting layers by causing said functional liquid droplet ejecting head to scan relative to the substrate and selectively eject the light emitting materials.

7. A method of manufacturing an electron emitting device, by using the ejection system according to claim 4, the electron emitting device having phosphors formed on electrodes thereof, the method comprising the steps of:

introducing fluorescent materials into said functional liquid droplet ejecting head; and forming the phosphors by causing said functional liquid droplet ejecting head to scan relative to the electrodes and selectively eject the fluorescent materials.

8. A method of manufacturing a PDP device, by using the ejection system according to claim 4, the PDP device having phosphors formed in concave portions of a back substrate thereof, the method comprising the steps of:

introducing fluorescent materials into said functional liquid droplet ejecting head; and forming the phosphors by causing the functional liquid droplet ejecting head to scan relative to the back substrate and selectively eject the fluorescent materials.

9. A method of manufacturing an electrophoresis display device, by using the ejection system according to claim 4, the electrophoresis display device having migration elements formed in concave portions of electrodes thereof, the method comprising the steps of: introducing migration element materials into said functional liquid droplet ejecting head; and forming the migration elements by causing said functional liquid droplet ejecting head to scan relative to the electrodes and selectively eject the migration element materials.

10. A method of manufacturing a color filter by using the ejection system according to claim 4, the color filter having filter elements arranged on a substrate thereof, the method comprising the steps of: introducing filter materials into said functional liquid droplet ejecting head; and forming the filter elements by causing said functional liquid droplet ejecting head to scan relative to the substrate and selectively eject the filter materials.

11. The method according to claim 10, wherein said color filter includes an overcoating layer covering said filter elements, and the method further including, subsequent to the step of forming the filter elements, the steps of: introducing a transparent coating material into said functional liquid droplet ejecting head; and forming the overcoating layer by causing said functional liquid droplet ejecting head to scan relative to the substrate and selectively eject the coating material.

12. A method of manufacturing an organic EL, by using the ejection system according to claim 4, the organic EL having pixels, including EL light emitting layers, arranged on a substrate thereof, the method comprising the steps of:
introducing light emitting materials into said functional liquid droplet ejecting head; and
forming the EL light emitting layers by causing said functional liquid droplet ejecting head to scan relative to the substrate and selectively eject the light emitting materials.

13. The method according to claim 12, wherein the organic EL includes pixel electrodes formed between the EL light emitting layers and the substrate in a manner associated with the EL light emitting layers, respectively, the method further including the steps of: introducing an electrode material in a liquid form into said functional liquid droplet ejecting head; and forming the pixel electrodes, by causing said functional liquid droplet ejecting head to scan relative to the substrate and selectively eject the electrode material.

14. The method according to claim 13, wherein the organic EL has opposed electrodes formed in a manner covering the EL light emitting layers, the method further comprising, subsequent to the step of forming the EL light emitting layers, the steps of: introducing an electrode material in a liquid form into said functional liquid droplet ejecting; and forming the opposed electrodes, by causing said functional liquid droplet ejecting head to scan relative to the substrate and selectively eject the electrode material in the liquid form.

15. A method of forming particulate spacers, by using the ejection system according to claim 4, the spacers creating very small cell gaps between two substrates, the method comprising the steps of: introducing a particle material for forming the spacers into said functional liquid droplet ejecting heads; and causing said functional liquid droplet ejecting head to scan relative to at least one of the two substrates and selectively eject the particle material, thereby forming the spacers on the substrate.

16. A method of forming metal wiring on a substrate, by using the ejection system according to claim 4, the method comprising the steps of:
introducing a metal material in a liquid form into said functional liquid droplet ejecting head; and forming the metal wiring by causing said functional liquid droplet ejecting head to scan relative to the substrate and selectively eject the metal material.

17. A method of forming microlenses on a substrate, by using the ejection system according to claim 4, the method comprising the steps of:
introducing a lens material into said functional liquid droplet ejecting head; and forming the microlenses by causing said functional liquid droplet ejecting head to scan relative to the substrate and selectively eject the lens material.

18. A method of forming a resist having a desired shape on a substrate, by using the ejection system according to claim 4, the method comprising the steps of: introducing a resist material into said functional liquid droplet ejecting head;
and forming the resist by causing said functional liquid droplet ejecting head to scan relative to the substrate and selectively eject the resist material.

19. A method of forming light diffusers on a substrate, by using the ejection system according to claim 4, the method comprising the steps of:
introducing a light diffusing material into said functional liquid droplet ejecting head; and
forming the light diffusers by causing said functional liquid droplet ejecting head to scan relative to the substrate and selectively eject the light diffusing material.

* * * * *